US010320331B1

United States Patent
Abdo

(10) Patent No.: US 10,320,331 B1
(45) Date of Patent: Jun. 11, 2019

(54) APPLICATIONS OF A SUPERCONDUCTING DEVICE THAT MIXES SURFACE ACOUSTIC WAVES AND MICROWAVE SIGNALS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/048,979

(22) Filed: Jul. 30, 2018

(51) Int. Cl.
*G06N 99/00* (2019.01)
*H01L 39/02* (2006.01)
(Continued)

(52) U.S. Cl.
CPC .............. *H03D 7/005* (2013.01); *G06N 10/00* (2019.01); *H01L 39/025* (2013.01); *H01L 39/12* (2013.01); *H01L 39/223* (2013.01); *H03F 19/00* (2013.01); *H03H 9/24* (2013.01); *H03H 9/25* (2013.01); *H03F 2200/451* (2013.01); *H03H 9/02637* (2013.01)

(58) Field of Classification Search
CPC ........ H03D 7/005; G06N 10/00; H01L 39/12; H01L 39/223; H01L 39/025; H03H 9/25; H03H 9/24; H03H 9/02637; H03F 19/00; H03F 2200/451
See application file for complete search history.

(56) References Cited

U.S. PATENT DOCUMENTS 5,837,332 A   11/1998   Takahashi et al.
6,563,310 B2   5/2003   Zagoskin
(Continued)

FOREIGN PATENT DOCUMENTS

EP    1035648 A2    9/2000
WO   2008006089 A2   1/2008
(Continued)

OTHER PUBLICATIONS

List of IBM Patents or Applications Treated as Related.
(Continued)

*Primary Examiner* — Kenneth B Wells
(74) *Attorney, Agent, or Firm* — Amin, Turocy & Watson, LLP

(57) ABSTRACT

Superconducting device applications implemented with a surface acoustic wave resonator and a superconducting microwave resonator coupled to a Josephson ring modulator are provided. A method can comprise receiving, by a microwave Josephson mixer, and from a superconducting surface acoustic wave resonator of a superconducting device, a surface acoustic wave signal that comprises one or more phonons that resonate at a first frequency. The method can also comprise receiving, by the microwave Josephson mixer and from a superconducting microwave resonator of the superconducting device, a microwave signal that comprises one or more photons that can resonate at a second frequency. Further, the method can also comprise mixing, by the microwave Josephson mixer, the surface acoustic wave signal and the microwave signal based on a microwave control signal received from a microwave source operatively coupled to the microwave Josephson mixer.

25 Claims, 17 Drawing Sheets

(51) Int. Cl.

| | |
|---|---|
| *H03D 7/00* | (2006.01) |
| *H03H 9/24* | (2006.01) |
| *H03F 19/00* | (2006.01) |
| *H03H 9/25* | (2006.01) |
| *H01L 39/22* | (2006.01) |
| *H01L 39/12* | (2006.01) |
| *G06N 10/00* | (2019.01) |
| *H03H 9/02* | (2006.01) |

(56) References Cited

U.S. PATENT DOCUMENTS

| | | | |
|---|---|---|---|
| 6,797,338 | B2 | 9/2004 | Saitoh et al. |
| 6,900,454 | B2 | 5/2005 | Blais et al. |
| 8,111,083 | B1 | 2/2012 | Pesetski et al. |
| 8,878,626 | B2 | 11/2014 | Zmuidzinas et al. |
| 8,954,125 | B2 | 2/2015 | Corcoles Gonzalez et al. |
| 9,153,764 | B2 | 10/2015 | Colli |
| 9,260,289 | B2 | 2/2016 | Park |
| 9,350,460 | B2 | 5/2016 | Paik |
| 9,379,303 | B2 | 6/2016 | Gambetta et al. |
| 9,461,588 | B1 * | 10/2016 | Naaman .............. H03D 9/06 |
| 9,627,045 | B1 | 4/2017 | Mukhanov et al. |
| 9,680,452 | B1 * | 6/2017 | Abdo .............. H03K 3/38 |
| 9,697,473 | B2 * | 7/2017 | Abdo .............. H03K 17/92 |
| 9,806,711 | B1 * | 10/2017 | Abdo .............. H03K 17/92 |
| 9,843,312 | B2 * | 12/2017 | Abdo .............. H01L 39/025 |
| 9,858,532 | B2 * | 1/2018 | Abdo .............. H03H 3/00 |
| 9,906,206 | B2 | 2/2018 | Shih et al. |
| 9,948,254 | B2 | 4/2018 | Narla et al. |
| 10,014,859 | B2 * | 7/2018 | Abdo .............. G06N 10/00 |
| 10,062,829 | B1 * | 8/2018 | Abdo .............. H01L 39/025 |
| 10,074,793 | B2 * | 9/2018 | Abdo .............. H01L 27/18 |
| 10,097,143 | B2 * | 10/2018 | Abdo .............. H03F 1/42 |
| 10,103,730 | B1 * | 10/2018 | Abdo .............. H01P 1/10 |
| 2002/0036549 | A1 | 3/2002 | Matsuda et al. |
| 2016/0308502 | A1 | 10/2016 | Abdo et al. |
| 2017/0104695 | A1 | 4/2017 | Naaman |
| 2017/0199036 | A1 | 7/2017 | Moxley, III |
| 2017/0250673 | A1 | 8/2017 | Ruby et al. |
| 2018/0069288 | A1 | 3/2018 | Minev et al. |
| 2018/0113373 | A1 | 4/2018 | Witmer et al. |

FOREIGN PATENT DOCUMENTS

| | | |
|---|---|---|
| WO | 2016138406 A1 | 9/2016 |
| WO | 2016168642 A1 | 10/2016 |

OTHER PUBLICATIONS

Frattini et al., "3-wave mixing Josephson dipole element," Applied Physics Letters, 2017, vol. 110, Issue 22, ID 222603, American Institute of Physics, 5 pages.

Noguchi et al., "Qubit-assisted transduction for a detection of surface acoustic waves near the quantum limit," Oct. 2017, arXiv:1710.00467v1, 10 pages.

Moores et al., "Cavity quantum acoustic device in the multimode strong coupling regime," Nov. 2017, arXiv:1711.05913v1, Joint Institute for Laboratory Astrophysics, National Institute of Standards and Technology and the University of Colorado, 12 pages.

Magnusson et al., "Quantum Surface Acoustics," Applied Physics Letters, 2015, vol. 106, Issue 6, ID 063509, 4 pages.

Ekstrom et al., "Surface acoustic wave unidirectional transducers for quantum applications," Applied Physics Letters, 2017, vol. 110, ID 073105, AIP Publishing, 4 pages.

Gustafsson et al., "Propagating phonons coupled to an artificial atom," Science, Oct. 2014, vol. 346, Issue 6206, pp. 207-211, 6 pages.

Manenti et al., "Circuit quantum acoustodynamics with surface acoustic waves," Nature Communications, vol. 8, No. 975, 6 pages.

Bolgar et al., "Experimental demonstration of a two-dimensional phonon cavity in the quantum regime," 2017, arxiv:1710.06476, 7 pages.

Abdo et al., "Nondegenerate three-wave mixing with the Josephson ring modulator," Physical Review B, 2013, vol. 87, ID 014508, American Physical Society, 18 pages.

Abdo et al., "Josephson amplifier for qubit readout," Applied Physics Letters, 2011, vol. 99, ID 162506, American Institute of Physics, 4 pages.

Pillet et al., "A compact design for the Josephson mixer: The lumped element circuit," Applied Physics Letters, Jun. 2015, vol. 106, ID 222603, AIP Publishing, 7 pages.

Bergeal et al., "Phase preserving amplification near the quantum limit with a Josephson Ring Modulator," Dec. 2009, arXiv:0912.3407v1, 20 pages.

Bergeal et al., "Analog information processing at the quantum limit with a Josephson ring modulator," Nature Physics, Feb. 2010, Macmillan Publishers Limited, 7 pages.

Gu et al., "Microwave photonics with superconducting quantum circuits," Oct. 2017, arXiv:1707.02046v2, 170 pages. https://arxiv.org/pdf/1707.02046.pdf.

Abdo et al.,"Directional Amplification with a Josephson Circuit," Physical Review X, 2013, vol. 3, Issue 3, ID 031001, American Physical Society, 8 pages.

Notice of Allowance received for U.S. Appl. No. 16/049,006 dated Feb. 28, 2019, 25 pages.

* cited by examiner

APPLICATIONS OF A SUPERCONDUCTING DEVICE THAT MIXES SURFACE ACOUSTIC WAVES AND MICROWAVE SIGNALS

BACKGROUND

In quantum circuits, a Josephson ring modulator is coupled to two superconducting microwave resonators and three-way mixing is performed between differential modes supported by the two superconducting microwave resonators and a non-resonant, common drive fed to the Josephson ring modulator. Due to coupling the Josephson ring modulator to the two superconducting microwave resonators, the device is limited in the choice of the frequencies of the differential modes, which can cause one or more problems. For example, coupling the Josephson ring modulator to low-frequency, transmission-line resonators can have various problems, such as occupying a large area (e.g., a large footprint). Another problem is the relatively large linear inductance associated with the low resonance-frequency transmission-line compared to the inductance of the Josephson ring modulator. This can result in a very reduced participation ratio which in turn requires, for its operation, very high external quality factors (Qs) for the resonators. However, high external Qs for the resonators is undesirable because it can give rise to very narrow dynamical bandwidths, which severely limit the device usability and practicality.

In addition, coupling the Josephson ring modulator to low-frequency, lumped-element resonators can require the use of large lumped capacitances and large lumped inductances. Large lumped capacitances and inductances are difficult to realize in practice. Large capacitances can have considerable loss (lowering the internal Q of the device) and as a result can cause a considerable portion of the quantum signal to be lost. Large geometric inductances usually suffer from parasitic capacitances which limit their utility. Large kinetic inductances usually rely on unconventional thin superconductors which are difficult to fabricate and integrate.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein are devices, systems, methods, apparatuses, and/or computer program products that mix surface acoustic waves and microwave signals, facilitate lossless frequency conversion between a surface acoustic wave and a microwave signal, is a nondegenerate parametric Josephson amplifier for surface acoustic waves and microwave signals, and entangles a phononic mode and a photonic mode.

According to an embodiment, a method can comprise receiving, by a microwave Josephson mixer, and from a superconducting surface acoustic wave resonator of a superconducting device, a surface acoustic wave signal that comprises one or more phonons that resonate at a first frequency. The method can also comprise receiving, by the microwave Josephson mixer and from a superconducting microwave resonator of the superconducting device, a microwave signal that comprises one or more photons that can resonate at a second frequency. Further, the method can also comprise mixing, by the microwave Josephson mixer, the surface acoustic wave signal and the microwave signal based on a microwave control signal received from a microwave source operatively coupled to the microwave Josephson mixer. An advantage of such a method is that dissipationless, three-wave mixing and amplification can be performed between low microwave frequencies of the superconducting surface acoustic wave resonator and high microwave frequencies of the superconducting microwave resonator. Another advantage is that quantum information carried by a surface acoustic wave signal can be transduced into a microwave signal or vice versa in a unitary manner (e.g., the energy and phase coherence of the quantum signal are preserved). Also, this quantum operation can be controlled and enabled by a separate microwave control signal (referred to as the pump or pump device) received by the device.

In some implementations, the method can comprise transferring, by the microwave Josephson mixer, quantum information from the superconducting surface acoustic wave resonator to the superconducting microwave resonator (and/or from the superconducting microwave resonator to the surface acoustic wave resonator) based on an application of pump drive applied at a frequency difference between the microwave signal and the surface acoustic wave signal. An advantage of such a method is that the microwave control signal can be utilized to select the modes whose information is swapped or transduced.

In some implementations, the method can advantageously comprise disconnecting, by the microwave Josephson mixer, a connection or interaction between the superconducting surface acoustic wave resonator and the superconducting microwave resonator based on determining that the mixing of the surface acoustic wave signal and the microwave signal is to be stopped. Further, the method can comprise reenabling, by the microwave Josephson mixer, the connection or interaction between the superconducting surface acoustic wave resonator and the superconducting microwave resonator based on determining that the mixing of the surface acoustic wave signal and the microwave signal is to be restarted. An advantage of such a method is that the microwave Josephson mixer can control transfer of information between the surface acoustic wave signal and the microwave signal.

According to some implementations, the method can comprise transferring, by the microwave Josephson mixer, a first portion of quantum information between the superconducting surface acoustic wave resonator and the superconducting microwave resonator based on a first power of the microwave control signal. The method can also comprise transferring, by the microwave Josephson mixer, a second portion of quantum information between the superconducting surface acoustic wave resonator and the superconducting microwave resonator based on a second power of the microwave control signal. An advantage of such a method is that an amount of information transferred can be controlled by the microwave Josephson mixer and the power of the microwave control signal.

Another embodiment relates to a method that can comprise receiving, at a frequency converter, and from a superconducting surface acoustic wave resonator, a surface acoustic wave signal that comprises one or more phonons that resonate at a first frequency. The method can also comprise receiving, at the frequency converter and from a superconducting microwave resonator, a microwave signal that comprises one or more photons that resonate at a second frequency. Further, the method can comprise implementing, by the frequency converter, a lossless frequency conversion between first information of the superconducting surface acoustic wave resonator and second information of the superconducting microwave resonator based on a pump signal received from a microwave source. An advantage of such a method is that the conversion between the surface acoustic wave and the microwave signal is a lossless frequency conversion.

According to some implementations, the method can comprise mapping, by the frequency converter, a propagating radio frequency signal to a phononic mode in the superconducting surface acoustic wave resonator. Further, the method can comprise upconverting, by the frequency converter, the phononic mode to a photonic mode in the superconducting microwave resonator via an application of a microwave control signal (e.g., pump) with a defined frequency. Upconverting the phononic mode can be enabled by a lossless three-wave mixing interaction. An upconverted microwave signal propagates upon leaving the superconducting microwave resonator. An advantage of such a method is that a propagating phonon mode or low-frequency microwave signal can be upconverted to a propagating photonic mode (e.g., high-frequency microwave mode) via a lossless three-wave mixing interaction.

Alternatively, the method can comprise mapping, by the frequency converter, a propagating microwave signal to a photonic mode in the superconducting microwave resonator. Further, the method can comprise downconverting, by the frequency converter, the photonic mode to a phononic mode in the superconducting surface acoustic wave resonator via an application of a microwave control signal (e.g. the pump) with a defined frequency. Downconverting the photonic mode can be enabled by a lossless three-wave mixing interaction. Further, a downconverted surface acoustic wave signal can propagate upon leaving the superconducting surface acoustic wave resonator. An advantage of such a method is that a propagating photonic mode (e.g., high-frequency microwave mode) can be downconverted to a propagating phononic mode or low-frequency microwave mode via a lossless three-wave mixing interaction.

In accordance with another embodiment, provided is a method that can comprise amplifying, by a Josephson parametric amplifier, first quadratures of a surface acoustic wave signal entering a first port of a device and second quadratures of a microwave signal entering a second port of the device. Further, the method can comprise outputting, by the Josephson parametric amplifier, and through an output port, a first amplified signal that comprises a first reflective signal and a first transmitted signal with frequency conversion and a second amplified signal that comprises a second reflective signal and a second transmitted signal with frequency conversion. An advantage of such a method is that the method can function as a phase-preserving quantum-limited amplifier for low-frequency and high-frequency microwave signals.

In another embodiment, provided is a method that can comprise inputting, by an entanglement component, a first input signal that comprises a first frequency into a superconducting surface acoustic wave resonator. A first qubit is operatively coupled to the entanglement component via the superconducting surface acoustic wave resonator. The method can also comprise inputting, by the entanglement component a second input signal that comprises a second frequency into a superconducting microwave resonator. A second qubit is operatively coupled to the entanglement component via the superconducting microwave resonator.

The method can also comprise outputting, by the entanglement component, an output signal that comprises an amplified superposition of input fields entering the superconducting surface acoustic wave resonator and the superconducting microwave resonator. An advantage of such a method is that the entanglement can be between a phononic mode and a photonic mode.

A further embodiment relates to a superconducting device that can comprise a first superconducting qubit capacitively coupled to a superconducting surface acoustic wave resonator and a second superconducting qubit capacitively coupled to a superconducting microwave resonator. The superconducting device can also comprise a Josephson ring modulator coupled to the superconducting surface acoustic wave resonator and the superconducting microwave resonator. An advantage of such a superconducting device is that the device can be operate as a nondegenerate amplifier and entanglement can be generated between the qubits via entanglement of the phonons supported by the superconducting surface acoustic wave resonator and photons supported by the superconducting microwave resonator.

DETAILED DESCRIPTION

Figure 1:
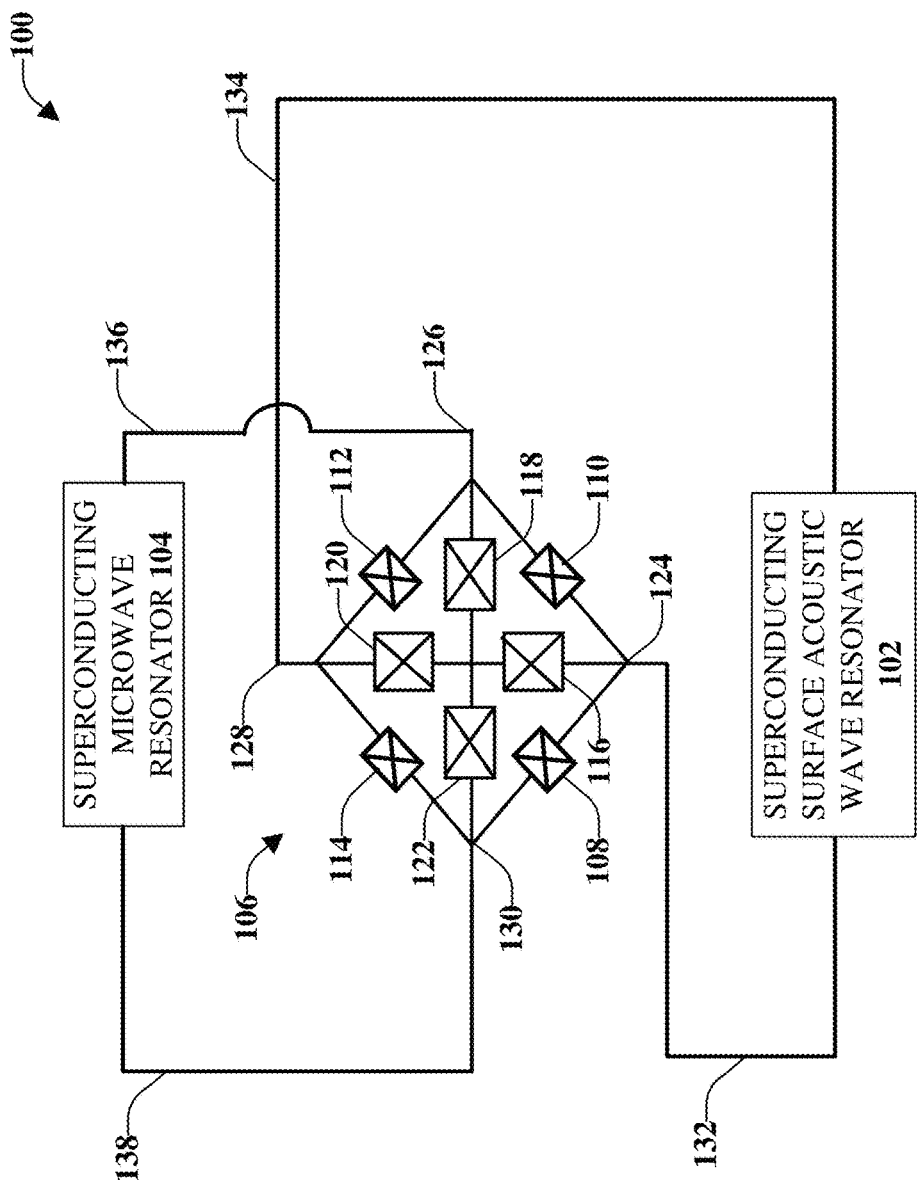
FIG. 1 illustrates an example, non-limiting block diagram of a circuit comprising the Josephson ring modulator in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As it relates to circuits, and more specifically quantum circuits, if a Josephson ring modulator (JRM) is coupled to two superconducting wave resonators, there is a limitation with respect to the choice of differential modes. For example, a problem associated with coupling the JRM to low-frequency, transmission-line resonators is that a large area is occupied by the device. As another example, a problem associated with coupling a JRM to low frequency lumped-element resonators is that large capacitors are relatively lossy. A solution provided by the superconducting device, the superconducting circuit, and the methods discussed herein is that a superconducting surface acoustic wave resonator is utilized, which is compact and, therefore, a size and/or a loss of the superconducting device can be reduced.

Another problem associated with prior art superconducting devices (e.g., devices that utilize two superconducting microwave resonators) is that the prior art superconducting devices are limited to mixing frequencies between 5 Gigahertz (GHz) and 15 GHz. The various superconducting devices, circuits, and methods discussed herein provide a solution to this problem through the utilization of a superconducting surface acoustic wave resonator and superconducting wave resonator that enable dissipationless, three-wave mixing and amplification between low microwave frequencies (e.g., about 0.1 GHz to about 4 GHz) and high microwave frequencies (e.g., around 5 GHz to around 15 GHz).

Given the above problems with prior art superconducting devices, the various aspects provided herein can be implemented to produce a solution to one or more of these problems in the form of a superconducting device, superconducting circuit, and method of fabricating the same. Such systems, devices, circuits, methods, and/or computer program products implementing such a superconducting device can have an advantage of reduced size and low-loss resonators, as compared to conventional techniques.

According to some implementations, the device can function as a Josephson mixer between surface acoustic waves (phonons) and microwave signals (photons). Additionally, or alternatively, the device can function as a lossless frequency converter between a surface acoustic wave and a microwave signal. Additionally, or alternatively, the device can function as a nondegenerate parametric Josephson amplifier for a surface acoustic wave and a microwave signal. In additional or alternative implementations, the device can function as an entangler of a phononic mode and photonic mode.

FIG. 1 illustrates an example, non-limiting block diagram of a circuit 100 in accordance with one or more embodiments described herein. The circuit 100 can comprise a superconducting surface acoustic wave (SAW) resonator (referred to as a superconducting SAW resonator 102), a superconducting microwave resonator 104, and a Josephson ring modulator (referred to as a JRM 106).

In a piece of quantum hardware, which includes the superconducting qubits space, a mechanism to implement gate operations or measurements on the quantum hardware is to generate microwave signals or receive microwave signals by the superconducting SAW resonator 102 and/or via the superconducting microwave resonator 104. As discussed herein, according to some implementations, the circuit 100 can operate as a Josephson mixer between surface acoustic waves (phonons) and microwave signals (photons). Further, the circuit 100 can operate as a lossless frequency converter between a surface acoustic wave and a microwave signal. In some implementations, the circuit 100 can operate as a nondegenerate parametric Josephson amplifier for a surface acoustic wave and a microwave signal. In additional and/or alternate implementations, the device can operate as an entangler of a phononic mode and photonic mode.

SAW resonators (e.g., the superconducting SAW resonator 102) are electro-mechanical resonators for phonons, which can resonate at microwave frequencies of around 0.5 GHz to 5 GHz. Surface acoustic wave resonators (or surface acoustic wave filters) are used in many telecommunication applications (e.g., mobile phones). SAW resonators can also be useful in quantum computing applications and quantum circuits in the microwave domain, as discussed herein. Further, surface acoustic wave resonators can have high internal Quality (Q) factors, which can be in excess of $10^5$. Therefore, SAW resonators can have a very low loss. In addition, SAW resonators are very compact. For example, the surface acoustic resonance wavelengths are very short (e.g., less than 1 micro meter or <1 μm).

The superconducting SAW resonator 102 can be a low frequency device and the superconducting microwave resonator 104 can be a high frequency device. Further, the superconducting SAW resonator 102 can be implemented on a low-loss piezo-electric dielectric substrate. The low-loss piezo-electric dielectric substrate can comprise a material selected from a group of materials comprising quartz, gallium arsenide, lithium niobite, and/or zinc oxide, or the like. The superconducting microwave resonator 104 can be implemented using lumped-element capacitance and lumped-element inductance. Further details related to the superconducting SAW resonator 102 and the superconducting microwave resonator 104 will be provided below with respect to FIGS. 2 and 3.

The JRM 106 is a device that can be based on Josephson tunnel junctions. For example, the JRM 106 can comprise one or more Josephson junctions arranged in a Wheatstone-bridge configuration. The one or more Josephson junctions can comprise a material selected from a group of materials comprising aluminum and niobium. Further, the JRM 106 can perform non-degenerate mixing in the microwave regime, without losses. According to some implementations, the JRM 106 can be a dispersive nonlinear three-wave mixing element.

The JRM 106 can support two differential modes and two common modes (one of which is at zero frequency, and, therefore, not applicable to the one or more embodiments described herein). By coupling the JRM 106 to a suitable electromagnetic environment (which supports two differential microwave modes), the circuit 100 can be used to perform various quantum processing operations such as lossless frequency conversion in the microwave domain, parametric amplification at the quantum limit (e.g., amplification of quantum signals in the microwave domain), and/or generation of two-mode squeezing.

The Josephson ring modulator (e.g., the JRM 106) can comprise one or more Josephson junctions arranged in a Wheatstone-bridge configuration. The Josephson junctions are illustrated as a first Josephson junction 108, a second Josephson junction 110, a third Josephson junction 112, and a fourth Josephson junction 114. The Josephson junctions (e.g., the first Josephson junction 108, the second Josephson junction 110, the third Josephson junction 112, the fourth Josephson junction 114) can be formed in a loop. Further, the Josephson junctions can be utilized to perform the mixing as discussed herein.

The JRM 106 also can comprise four additional junctions (internal to the loop), which can be shunt junctions according to some implementations. These four additional junctions are labeled as a first internal junction 116, a second internal junction 118, a third internal junction 120, and a fourth internal junction 122. The four internal junctions (e.g., the first internal junction 116, the second internal junction 118, the third internal junction 120, and the fourth internal junction 122) can facilitate tuning of the frequency of the circuit 100. The tunability can be obtained with the application of external magnetic flux. In this configuration, the four internal junctions, which are larger than the junctions on the outer loop, can function as linear inductors shunting the outer Josephson junctions. By threading external flux through the inner loops, the total inductance of the JRM 106 can change, which can lead to a change in the resonance frequencies of the resonators coupled to the JRM 106.

In addition, the configuration of the JRM 106 defines points or nodes where the external junctions meet. Accordingly, there can be a first node 124 at the bottom of the JRM 106; a second node 126 at the right side of the JRM 106; a third node 128 at the top of the JRM 106; and a fourth node 130 at the left side of the JRM 106. It is noted that the terms bottom, right side, top, and left side are for purposes of explaining the disclosed aspects with respect to the figures and the disclosed aspects are not limited to any particular plane or orientation of the JRM 106 and/or the circuit 100 and its associated circuitry.

The four nodes (e.g., the first node 124, the second node 126, the third node 128, and the fourth node 130) can be utilized to define the differential mode and the common mode hosted by the circuit 100. The modes can be orthogonal and do not overlap one another. Further, the nodes, as illustrated, can be physically orthogonal. For example, the first node 124 and the third node 128 are vertical to one another and the second node 126 and the fourth node 130 are horizontal to one another.

The nodes can be utilized to couple the JRM 106 to the superconducting SAW resonator 102 and to the superconducting microwave resonator 104. For example, a first set of opposite nodes (e.g., the first node 124 and the third node 128) can be chosen to operatively couple the JRM 106 to the superconducting SAW resonator 102. The first node 124 can be coupled to the superconducting SAW resonator 102 via a first wire 132 (or first lead) and the third node 128 can be coupled to the superconducting SAW resonator 102 via a second wire 134 (or second lead).

The second set of opposite nodes (e.g., the second node 126 and the fourth node 130) can be chosen to operatively couple the JRM 106 to the superconducting microwave resonator 104. For example, the second node 126 can be coupled to the superconducting microwave resonator 104 via a third wire 136 (or third lead) and the fourth node 130 can be coupled to the superconducting microwave resonator 104 via a fourth wire 138 (or fourth lead).

As illustrated, the first wire 132 and the second wire 134 can be coupled to the superconducting SAW resonator 102 at different locations of the superconducting SAW resonator 102. Further, the third wire 136 and the fourth wire 138 can be coupled to the superconducting microwave resonator 104 at different locations of the superconducting microwave resonator 104. Further details related to the coupling locations will be provided below with respect to FIG. 3.

The superconducting SAW resonator 102, the superconducting microwave resonator 104, and the JRM 106 are portions of a frequency-converter/mixer/amplifier/entangler device. The device can receive external microwave photons or phonons from other quantum devices connected to the microwave port and/or the SAW port of the device.

The circuit 100, as well as other aspects discussed herein can be utilized in a device that facilitates manipulation of quantum information in accordance with one or more embodiments described herein. Aspects of devices (e.g., the circuit 100 and the like), systems, apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

In various embodiments, the device can be any type of component, machine, system, device, facility, apparatus, and/or instrument that comprises a processor and/or can be capable of effective and/or operative communication with a wired and/or wireless network. Components, machines, apparatuses, systems, devices, facilities, and/or instrumentalities that can comprise the device can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

In various embodiments, the device can be a quantum computing device or quantum computing system associated with technologies such as, but not limited to, quantum circuit technologies, quantum processor technologies, quantum computing technologies, artificial intelligence technologies, medicine and materials technologies, supply chain and logistics technologies, financial services technologies, and/or other digital technologies. The circuit 100 can employ hardware and/or software to solve problems that are highly technical in nature, that are not abstract and that cannot be performed as a set of mental acts by a human. Further, in certain embodiments, some of the processes performed can be performed by one or more specialized computers (e.g., one or more specialized processing units, a specialized computer with a quantum computing component, etc.) to carry out defined tasks related to machine learning.

The device and/or components of the device can be employed to solve new problems that arise through advancements in technologies mentioned above, computer architecture, and/or the like. One or more embodiments of the device can provide technical improvements to quantum computing systems, quantum circuit systems, quantum processor systems, artificial intelligence systems and/or other systems. One or more embodiments of the circuit 100 can also provide technical improvements to a quantum processor (e.g., a superconducting quantum processor) by improving processing performance of the quantum processor, improving processing efficiency of the quantum processor, improving processing characteristics of the quantum processor, improving timing characteristics of the quantum processor, and/or improving power efficiency of the quantum processor.

Figure 2:
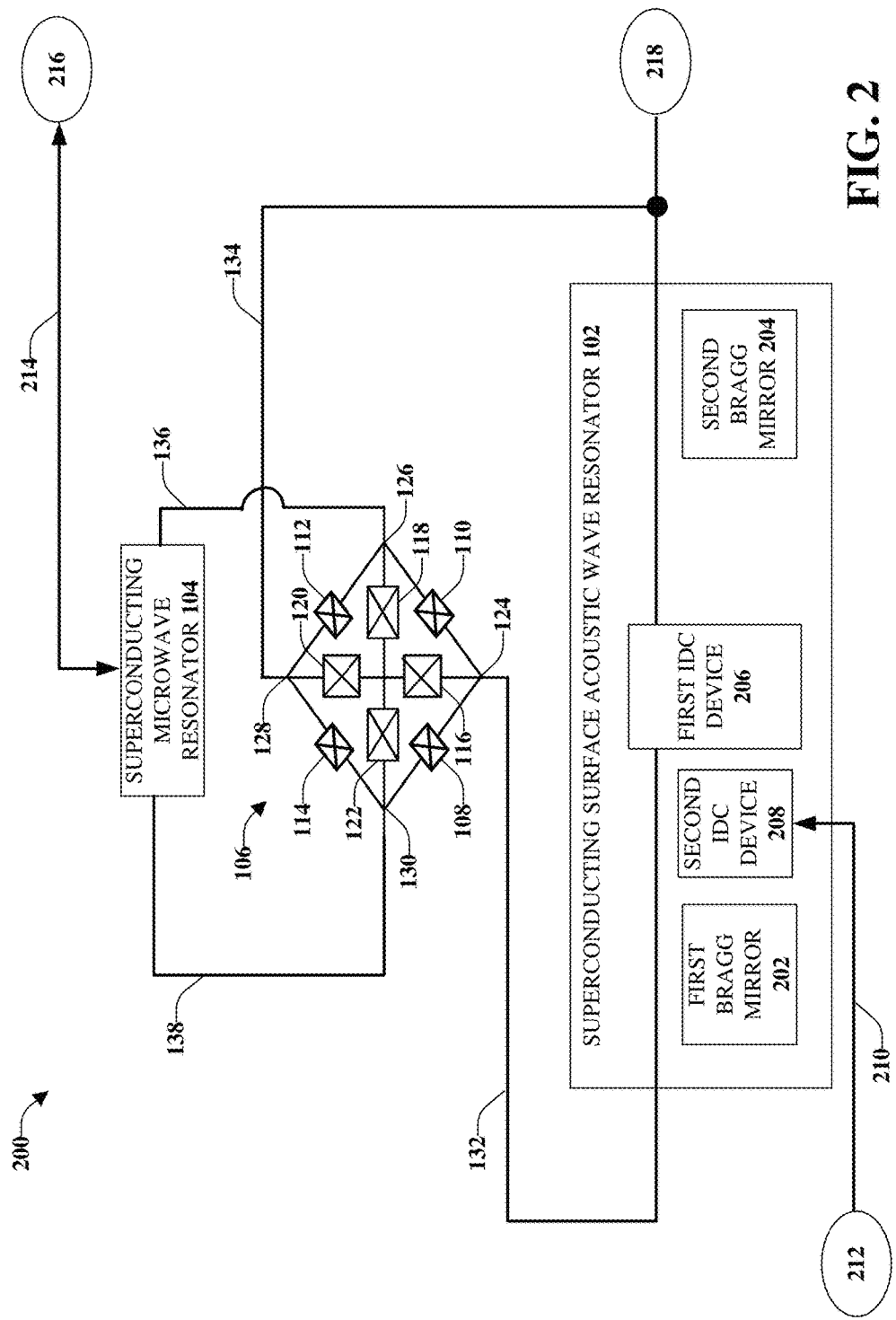
FIG. 2 illustrates an example, non-limiting block diagram of a circuit comprising a superconducting surface acoustic wave resonator in accordance with one or more embodiments described herein.

FIG. 2 illustrates an example, non-limiting block diagram of a circuit 200 comprising a superconducting surface acoustic wave (SAW) resonator in accordance with one or more embodiments described herein. Repetitive description of like elements employed in other embodiments described herein is omitted for sake of brevity.

The superconducting SAW resonator 102 can comprise a first superconducting metallic/dielectric mirror (e.g., a first Bragg mirror 202) and a second superconducting metallic/dielectric mirror (e.g., a second Bragg mirror 204). The first Bragg mirror 202 can be separated from the second Bragg mirror 204 by a distance that is an odd integer multiple of a half-wavelength supported by the superconducting SAW resonator 102. A Bragg mirror comprises a periodic structure of metallic fingers and dielectric gaps positioned at a defined distance from one another.

According to some implementations, the superconducting SAW resonator 102 can be attached to (e.g., realized on) a low-loss piezo-electric dielectric substrate (not shown). The low-loss piezo-electric dielectric substrate can comprise a material selected from a group of materials comprising one or more of quartz, gallium arsenide, lithium niobite, and zinc oxide, or a similar material.

Further, a first interdigitated capacitance device or first IDC device 206 and a second IDC device 208 can be included. The first IDC device 206 can couple between the superconducting SAW resonator 102 and the JRM 106. The second IDC device 208 can couple between the superconducting SAW resonator 102 and an external port (e.g., a signal port 212).

For example, the first IDC device 206 can be positioned at a center of the superconducting SAW resonator 102. A first set of opposite nodes of the JRM 106 can be connected to opposite nodes of the first IDC device 206. For example, the first node 124 of the JRM 106 can be connected to a first side of the first IDC device 206 (e.g., via the first wire 132). Further, the third node 128 of the JRM 106 can be connected to a second side of the first IDC device 206 (e.g., via the second wire 134).

A second set of opposite nodes of the Josephson ring modulator can be connected to the superconducting microwave resonator 104. For example, the second node 126 of the JRM 106 can be connected to a first side of the superconducting microwave resonator 104 (e.g., via the third wire 136). Further, the fourth node 130 of the JRM 106 can be connected to a second side of the superconducting microwave resonator 104 (e.g., via the fourth wire 138).

The circuit 100 can also comprise a first external feedline 210 coupled to the superconducting SAW resonator 102 through the second IDC device 208. The first external feedline 210 can be connected to a signal port 212 (e.g., a radio frequency (rf) source). The first external feedline 210 can carry one or more input signals and one or more output signals of the superconducting SAW resonator 102.

A second external feedline 214 can be coupled to the superconducting microwave resonator 104. The second external feedline 214 can be connected to an idler port 216 (e.g., a microwave source). The second external feedline 214 can carry one or more input signals and one or more output signals of the superconducting microwave resonator 104.

Further, the JRM 106 can be operative connected to a pump port 218 (e.g., via the second wire 134 or another wire). The pump port 218 can be connect to a microwave source. The pump port 218 can supply the required energy for the operation of the circuit 100. For example, upon or after pump power is supplied from the pump port 218 to the JRM 106, the superconducting SAW resonator 102 and the superconducting microwave resonator 104 can be electrically connected through the JRM 106. However, when power is not supplied through the pump port 218 (e.g., the power supply is off), the superconducting SAW resonator 102 and the superconducting microwave resonator 104 can be electrically isolated from one another.

For amplification, ideally there would be a microwave signal that is propagating on the idler transmission line (e.g., the second external feedline 214) that is connected to the idler port 216. In an example, assume that the microwave signal is weak and it carries some quantum information that is of value. The information goes into the circuit 100 and there is a pump tone that is fed to the device (e.g., via the pump port 218) that can generate a parametric amplification between the idler mode and the signal mode supported by the superconducting SAW resonator 102. In this example, an input signal is not needed at both the signal port 212 and the idler port 216. Instead, a signal is only needed on one port and quantum noise can enter through the other port. The deterministic signal carrying quantum information and the quantum noise can be mixed by the device via the pump drive and amplified upon leaving the device. Thus, the signal that carries information can come either from the signal port 212, or the idler port 216, or can have two signals carrying information entering both ports at substantially the same time. For simplicity, assume the signal is entering the circuit 100 through one port and the other port is only receiving quantum noise. In this case, through the interaction with the pump (e.g., the pump port 218) and the JRM 106 three-wave mixing takes place between the common mode (pump) and two differential modes (the idler and the signal). If the pump frequency is the sum of the signal and idler resonance frequencies, the device functions as a phase-preserving parametric amplifier operating near the quantum limit. The respective output signal exiting the signal port 212 and idler port 216 can be an amplified superposition of the input signals entering both ports (e.g., the signal port 212 and idler port 216).

According to some implementations, magnetic flux threading the JRM 106 can be induced through the one or more external superconducting magnetic coils. For example, magnetic flux threading the JRM 106 can be induced using external superconducting magnetic coils attached to a device package or using on-chip flux lines.

Figure 3:
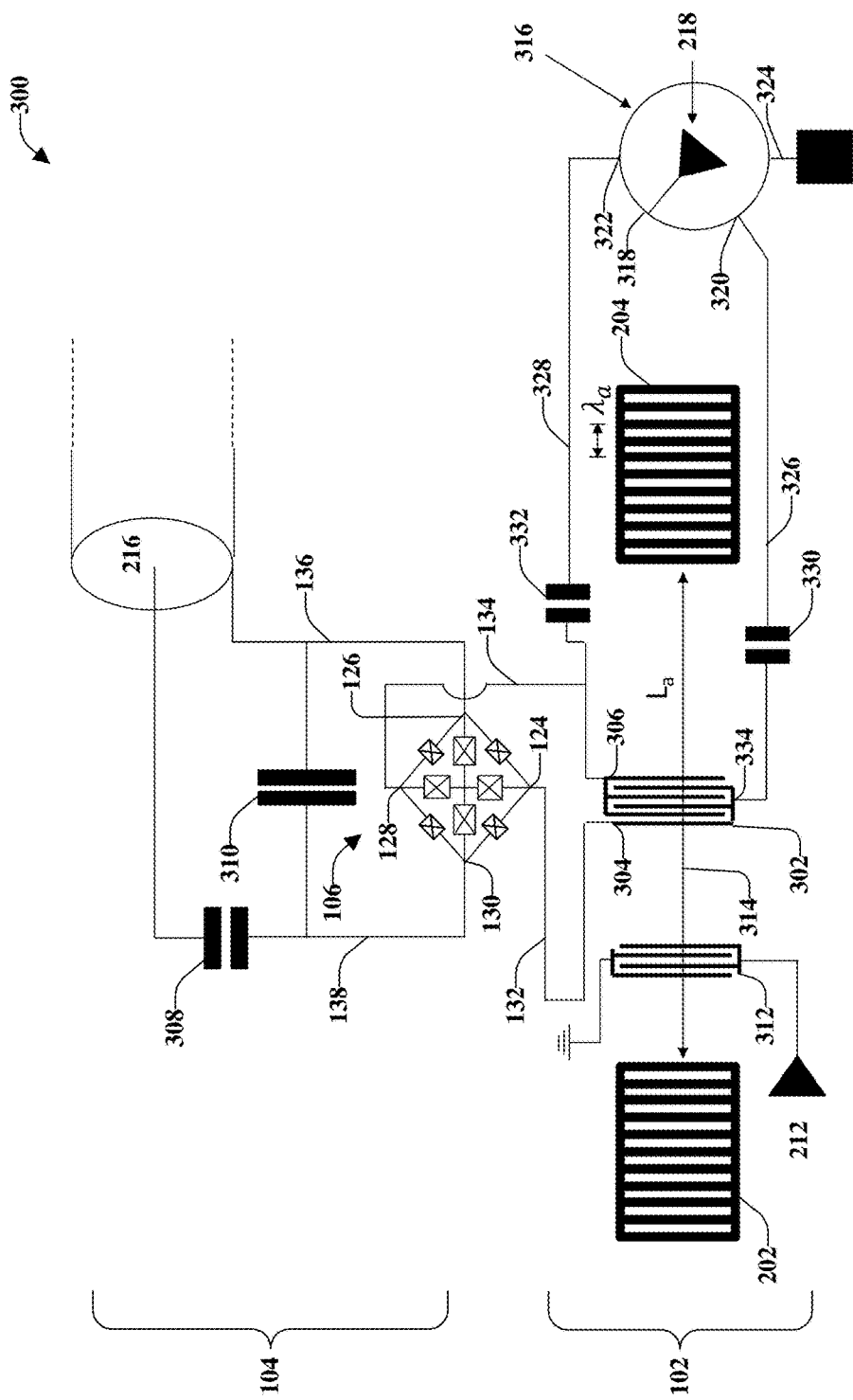
FIG. 3 illustrates an example, non-limiting, schematic of a circuit for a superconducting device that comprises a surface acoustic wave resonator and superconducting microwave resonator coupled to a Josephson ring modulator in accordance with one or more embodiments described herein.

In further detail, FIG. 3 illustrates an example, non-limiting, schematic of a circuit 300 for a superconducting device that comprises a surface acoustic wave resonator and superconducting microwave resonator coupled to a Josephson ring modulator in accordance with one or more embodiments described herein. Repetitive description of like elements employed in other embodiments described herein is omitted for sake of brevity.

It is noted that the Josephson junctions and the four internal junctions of the JRM 106 are not labeled in FIG. 3 for purposes of simplicity. However, the element numbering of the junctions for purposes of explanation are the same as the labeling of FIGS. 1 and 2. In addition, the circuit 300 and its associated components can be implemented on a single chip, according to some implementations.

As mentioned, the nodes of the JRM 106 can comprise a first set of opposite nodes that can be oriented in a vertical direction to one another. For example, the first set of opposite nodes can comprise the first node 124 and the third node 128, which can operatively couple the JRM 106 to the superconducting SAW resonator 102 (e.g., via the first wire 132 and the second wire 134). Further, the nodes of the JRM 106 can comprise a second set of opposite nodes, which can be oriented in a horizontal manner. For example, the second set of opposite nodes can comprise the second node 126 and the fourth node 130, which can operatively couple the JRM 106 to the superconducting microwave resonator 104. It is noted that although illustrated and described with respect to a horizontal direction and/or a vertical direction, the disclosed aspects are not limited to this orientation and other orientations can be utilized.

The first set of opposite nodes (e.g., the first node 124 and the third node 128) can be coupled to opposite electrodes of a first interdigitated capacitor or first IDC 302 (e.g., the first IDC device 206) of the superconducting SAW resonator 102, creating a first orthogonal mode. For example, the first node 124 of the JRM 106 can be coupled to a first electrode of the first IDC 302, indicated at 304. Further, the third node 128 of the JRM 106 can be coupled to a second electrode of the first IDC 302, indicated at 306. The first IDC 302 can be positioned at a center of the superconducting SAW resonator 102.

The second set of opposite nodes (e.g., the second node 126 and the fourth node 130) can be coupled to a second capacitor 310 (e.g., a shunting capacitor) forming a superconducting microwave resonator 104, where the JRM is the inductive element of the resonator. The superconducting microwave resonator can support a second orthogonal differential mode of the JRM 106. The capacitance (e.g., the first capacitor 308) functions as a coupling capacitor between the microwave resonator (formed by the JRM 106 and the second capacitor 310) and the external feedline/port (e.g., the idler port 216) of the device. According to some implementations, the first capacitor 308 and the second capacitor 310 can be respective capacitors chosen from a group of capacitors comprising a gap capacitor, an interdigitated capacitor, and/or a plate capacitor. In the case of plate capacitance, the dielectric material should have very low-loss at the level of single microwave photons.

As illustrated, the superconducting SAW resonator 102 can comprise the first IDC 302, a second IDC 312 (e.g., the second IDC device 208), and a set of metallic/dielectric mirrors (e.g., the first Bragg mirror 202 and the second Bragg mirror 204). The components of the superconducting SAW resonator 102 (e.g., the first IDC 302, the second IDC 312, the first Bragg mirror 202, the second Bragg mirror 204) is implemented on a piezo-electric substrate. For example, the piezo electric substrate can comprise one or more of quartz, gallium arsenide, lithium niobite, zinc oxide, and/or similar materials.

Different ports can be utilized to access the superconducting SAW resonator 102 and the superconducting microwave resonator 104. For example, the signal port 212 can be utilized to access the superconducting SAW resonator 102 and the idler port 216 can be utilized to access the superconducting microwave resonator 104.

The signal port 212 can be utilized to carry input signals and output signals. Therefore, in order to measure output signals from the superconducting SAW resonator 102, an IDC (e.g., the second IDC device 208) can be placed between the first Bragg mirror 202 and the second Bragg mirror 204. One set of IDC fingers that are connected together are located at an rf-voltage anti-node (maximum/minimum) of the supported phononic mode. Therefore, the spacing between the fingers can be determined by the wavelength supported by the superconducting SAW resonator 102.

A distance between the centers of two consecutive fingers of the IDCs (e.g., the first IDC 302 and the second IDC 312) can be generally expressed as $\lambda_a/2$. The respective two sets of fingers of the IDCs can have opposite polarity according to an implementation. Further, the first Bragg mirror 202 and the second Bragg mirror 204 can be separated from one other, as indicated by line 314, by a distance that is an odd integer multiple of half-wavelength supported by the superconducting SAW resonator 102. The defined distance can be expressed as $L_a$, wherein $L_a$ is an odd-integer multiple of $\lambda_a/2$. Where $\lambda_b < \lambda_a$.

A microwave tone is characterized by a wave that has a maximum amplitude and a minimum amplitude. The minimum amplitude should couple to one finger of the IDC (e.g., indicated at 304 or 306) and the maximum value should couple to the other finger, (e.g., indicated at 304 or 306) where the two fingers are connected to opposite nodes of the JRM 106 (e.g., the first node 124 and the third node 128). Therefore, the distance $\lambda_a/2$ can be selected to facilitate the maximum on the first finger and the minimum on the other finger.

Further, for purposes of explanation, the maximum amplitude has a plus sign (or a positive value) and the minimum amplitude has a minus sign (or a negative value). Therefore, the two opposite nodes of the JRM 106 can be excited by the positive (on the first finger) and the negative rf-voltages (on the second finger). These signals can alternate with time. However, they should be opposite to one another at any given time. When the polarity is different, it can be referred to as a differential mode (where differential means opposite sign).

This can also apply to the case of the superconducting microwave resonator 104. As mentioned, the superconducting microwave resonator can comprise a first capacitor 308 coupling the resonator to the external port (e.g., the idler port 216) and the second capacitor 310 shunting the JRM 106. The two electrodes of the capacitor shunting the JRM 106 (e.g., the second capacitor 310) can have opposite voltages and can excite a second differential mode. Accordingly, a first differential mode of the JRM 106 is supported by the superconducting SAW resonator 102 and a second differential mode of the JRM 106 is supported by the superconducting microwave resonator 104.

Further, in order to perform the mixing, or the amplification, microwave energy is supplied for device operation. The energy source for the mixing and/or amplification is supplied through the pump port 218. The pump port 218 can provide a microwave signal, which can be a strong, coherent non-resonant microwave tone that can supply energy for the circuit 100 to operate. According to some implementations, the microwave signal supplied by the pump port 218 can comprise a frequency that satisfies a defined equation determined based on the energy conservation of the three-wave mixing occurring in the circuit 100.

In an example of amplification performed by the device, a first signal $f_a$ which lies within the bandwidth of the superconducting SAW resonator 102 and a second signal $f_b$ which lies within the bandwidth of the superconducting microwave resonator 104. Further, the frequency of the second signal can be larger than the frequency of the first signal ($f_b > f_a$). To amplify both signals, the frequency of the pump tone fed through the pump port 218 should be the sum of the first signal and the second signal (e.g., $f_a + f_b$). The energy of the electromagnetic signal is proportional to its frequency. By taking the pump (e.g., the pump port 218) frequency to be the sum, if the pump interacts with the dispersive nonlinear medium (e.g., the JRM 106), a down-conversion process can occur where the energetic photons of the pump split into a first set of photons at $f_a$ and a second set of photons at $f_b$. If the frequency is the sum, then the photons can split in this manner. For example, the photons can split into two halves: a first half (e.g., the first set of photons) at the lower frequency $f_a$ and a second half (e.g., the second set of photons) at the higher frequency $f_b$. Therefore, amplification can occur because the pump exchanges energy with the signal mode and idler mode and through this exchange entangled photons are generated in both modes. Similarly, a conversion process with non photon-photon gain can convert one mode to the other (e.g., a photon to a phonon or a phonon to a photon). In this case, the pump frequency should be equal to the difference between $f_a$ and $f_b$. Here $f_b$ is larger, so the equation can be $f_b$ minus $f_a$.

According to an implementation, in the mixing process (conversion without photon-phonon gain) a phonon in the SAW resonator at the signal frequency can be upconverted into a microwave photon in the microwave resonator at the idler frequency. According to another implementation, the photon in the microwave resonator at the idler frequency can be downconverted to a phonon in the SAW resonator at the signal frequency. The energy exchange is enabled by the pump drive (e.g., fed through the pump port 218). Accordingly, either a pump photon is emitted or a pump photon is absorbed to facilitate the process.

If there is no pump signal applied to the pump port 218, the superconducting SAW resonator 102 and the superconducting microwave resonator 104 are separated (e.g., isolated from one another) and information exchange or information communications between the superconducting SAW resonator 102 and the superconducting microwave resonator 104 does not occur. Upon or after a pump signal is applied to the pump port 218, it excites the common mode of the JRM 106, as illustrated in FIG. 2, the superconducting SAW resonator 102 and the superconducting microwave resonator 104 interact and information is exchanged.

According to some implementations, the pump drive is fed through the sigma port of a 180-degree hybrid 316, which is capacitively coupled to opposite nodes of the JRM 106, which in turn excites a common-mode of the JRM 106. According to some implementations, the 180-degree hybrid 316 operates as a power splitter.

By way of explanation and not limitation, a 180-degree hybrid is a passive microwave component that comprises four ports. A first port is referred to as a sum port 318 (or sigma port). If a signal is input to the sum port 318, the signal splits equally between two other ports (e.g., a second port 320 and a third port 322). The signals that are output from the second port 320 and the third port 322 can have the same phase. Thus, the first port is referred to as the sum port 318 because the phases of the split signals are equal. The pump drive (e.g., the pump port 218) can be fed through the sum port 318 of the 180-degree hybrid 316.

A fourth port can be referred to as a delta port 324 (or a difference port). If a signal is injected through the delta port 324 of the 180-degree hybrid (which, in FIG. 3, is terminated with 50 ohms), the hybrid would split the signal into two signals, coming out of the two ports (e.g., the second port 320 and the third port 322), but the split signals have a 180-degree phase difference. For example, if a first signal has a maximum value at one port (e.g., 320), the second signal at the other port (e.g., 322) has a minimum value. The pump port 218 can be fed through the sum port 318.

Also illustrated are a first lead 326 coming out of the second port 320 and a second lead 328 coming out of the third port 322. The signals that are output at the second port 320 and the third port 322 are half of the pump signal and have the same phase, as discussed above. The signals encounter small coupling capacitors (e.g., a first coupling capacitor 330 and a second coupling capacitor 332) that can be coupled to two opposite nodes of the JRM 106. According to some implementations, the first coupling capacitor 330 and the second coupling capacitor 332 can be respective capacitors chosen from a group of capacitors comprising a gap capacitor, an interdigitated capacitor, and a plate capacitor. As it relates to plate capacitance, the dielectric material should have very low-loss at the level of single microwave photons.

The first coupling capacitor 330 can be coupled to the first node 124 of the JRM 106 (through the first IDC 302) and the second coupling capacitor 332 can be coupled to the third node 128 of the JRM 106. In further detail, the first lead 326 and the second lead 328 can couple to two different sets of fingers of the first IDC 302 (illustrated at the first contact point 306 and a third contact point 334), that couple to two opposite nodes of the JRM 106. This connection enables exciting the common mode of the JRM 106 where the two opposite nodes of the JRM 106 are excited, not with opposite rf-voltage signs, but with equal signs. For example, the two opposite nodes can be excited with a positive-positive signal or a negative-negative signal.

The first lead 326 and the second lead 328 can be connecting superconducting wires that should be equal in length (e.g., phase matched) between the ports (e.g., the second port 320, the third port 322) of the 180 degree hybrid and the coupling capacitors (e.g., the first coupling capacitor 330, the second coupling capacitor 332, respectively). Similarly, the first wire 132 and the second wire 134 can be connecting superconducting wires that should be equal in length (e.g., phase matched) between the opposite nodes of the JRM 106 and the electrodes of the first IDC 302. Also, the third wire 136 and the fourth wire 138 can be connecting superconducting wires that should be equal in length (e.g., phase matched) between the opposite nodes of the JRM 106 and the electrodes of the second capacitor 310. Further, the connecting superconducting wires should be as short as possible and wide (e.g., have small series inductance).

The following provides further technical comments for an understanding of the various aspects disclosed herein. The speed of sound in the various piezoelectric substrates can be slower than the speed of light by several orders of magnitude (e.g., approximately five orders of magnitude, for example, $10^5$).

The effective length of the superconducting SAW resonator 102 can be slightly larger than $L_a$. This can be because the reflection off the Bragg mirrors does not happen on the mirror edges but within a certain penetration depth inside the Bragg mirrors.

The effective length ($L_{eff}$) of the superconducting SAW resonator 102 and the speed of sound in the piezoelectric substrate ($v_s$) can determine the cavity free spectral range (FSR):

$$V_{FSR} = \frac{v_s}{2L_{eff}}.$$

The SAW resonator can be similar to photonic cavities that support multimodes (resonances). The cavity free spectral range parameter can determine the frequency spacing between the multimodes supported by the superconducting SAW resonator 102.

The larger the spacing between the Bragg mirrors, the larger $L_{eff}$ is, and as a result the smaller the frequency separation between the SAW resonator modes. The Bragg mirrors can operate as reflective mirrors within a certain bandwidth. Modes that fall beyond their bandwidth are not supported by the SAW resonator because their phononic modes are not confined.

Depending on the VFSR and the bandwidth of the Bragg mirrors, the circuit 100 can operate over a single, a few, or many modes of the SAW resonator. It is noted that not all the modes supported by the SAW resonator would strongly couple to the JRM. Three-wave mixing operations in the circuit 100 can take place with phononic modes that couple strongly to the JRM. Modes couple strongly to the JRM when their anti-nodes align with the IDC fingers coupled to the JRM.

The circuit 100 can be a three-wave mixer, such as a Josephson mixer that relies on non-linear inductance of the Josephson junctions, which is lossless. The Josephson mixer is used to allow mixing between phonons supported by the superconducting SAW resonator 102 and microwave signals, which are carried by photons. This is different from conventional devices that couple a phonon to a phonon or a photon to a photon. Therefore, the disclosed aspects provide a significant improvement in the coupling. For example, the circuit 100 can allow conversion from a microwave signal to acoustic waves that resonate at low microwave frequencies. Further, the circuit 100 can amplify in a nondegenerate manner Nondegenerate here means: (1) the circuit 100 is amplifying two different frequencies: one frequency at a high microwave frequency (example 12 GHz) and another relatively low microwave frequency (example 1 GHz), thus, nondegenerate means that the frequencies are different so there is a spectral nondegeneracy; and (2) there is also a spatial nondegeneracy because the microwave signal is supported by the superconducting microwave resonator 104, which is physically different than the superconducting SAW resonator 102 that supports the surface acoustic wave. Therefore, there is a spectral and a physical nondegeneracy. Due to this process of parametric amplification that is nondegenerate, the circuit 100 can entangle a phononic mode with a photonic mode, where entanglement is a quantum property where the two modes are strongly correlated with one another and inseparable from one another. Therefore, if a measurement is taken of one, the state of the other can be determined. Thus, they are entangled and they form one entity, although they can be separated in space by distance.

Figure 4:
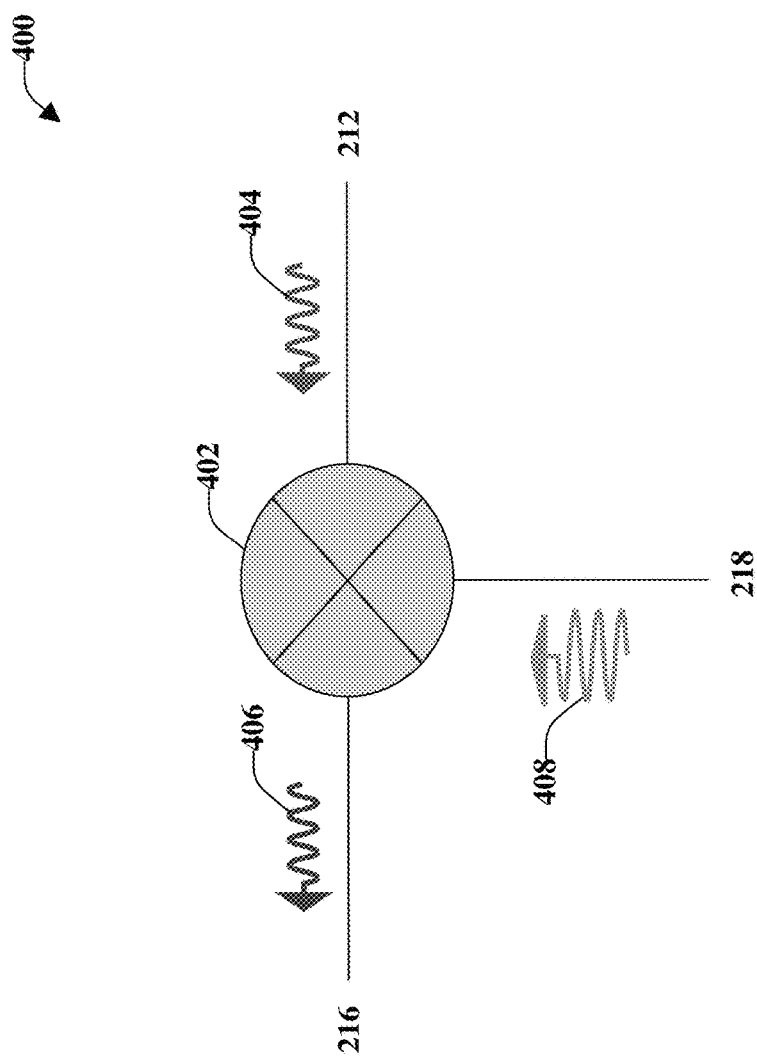
FIG. 4 illustrates an example, non-limiting schematic representation of a system that comprises a unitary Josephson mixer for surface acoustic waves (phonons) and microwave signals (photons) in accordance with one or more embodiments described herein.

FIG. 4 illustrates an example, non-limiting schematic representation of a system 400 that comprises a unitary Josephson mixer for surface acoustic waves (phonons) and microwave signals (photons) in accordance with one or more embodiments described herein. Repetitive description of like elements employed in other embodiments described herein is omitted for sake of brevity. The system 400 can comprise one or more of the components and/or functionality of the circuit 100, and vice versa.

The system 400 can comprise a microwave Josephson mixer 402 (e.g., the circuit 100 of FIG. 1). Mixers that are used traditionally in communications or other microwave applications can mix together microwave signals. However, traditional mixers do not mix together SAW waves and microwave signals in a lossless manner, as discussed herein and facilitated by the microwave Josephson mixer 402.

The microwave Josephson mixer 402 can receive, from the superconducting SAW resonator 102 (of the circuit 100) a surface acoustic wave signal (e.g., a SAW signal 404). The SAW signal 404 can comprise one or more phonons that can resonate at a first frequency. Further, the microwave Josephson mixer 402 can receive from the superconducting microwave resonator 104 (of the circuit 100) a microwave signal 406. The microwave signal 406 can comprise one or more photons that can resonate at a second frequency. For example, there can be a first port (e.g., the signal port 212) that can support the SAW signal 404 and a second port (e.g., the idler port 216) that can support the microwave signal 406. Further, a third port (e.g., the pump port 218) can support a microwave control signal 408 (also referred to a microwave drive signal).

The microwave control signal 408 can have a third frequency ($f_d$) that is larger than the microwave signal 406, which can have a second frequency ($f_2$) that is larger than a first frequency $f_1$ of the SAW signal 404. In an example, the microwave control signal 408 frequency ($f_d$) can be equal to the absolute value of the microwave signal 406 frequency ($f_2$) minus the SAW signal 404 frequency ($f_1$). This can be expressed as: $f_d = |f_2 - f_1|$.

The microwave Josephson mixer 402 can operate as a lossless microwave Josephson mixer between the SAW signal 404 that supports phonons and the microwave control signal 408 that is carried by photons. By way of explanation and not limitation, as compared to standard microwave Josephson mixer terminology, the SAW signal 404 frequency ($f_1$) can relate to an Intermediate Frequency (IF), the microwave signal frequency ($f_2$) can relate to a Radio Frequency (RF), and the microwave control signal 408 (or drive signal) frequency $f_{d=}|f_2 \cdot f_1|$, can relate to a Local Oscillator (LO).

Quantum information carried and/or stored by a superconducting SAW resonator 102 can be transferred to/from the superconducting microwave resonator 104 using the microwave Josephson mixer 402 and the microwave control signal 408. Accordingly, the microwave Josephson mixer 402 can mix the SAW signal 404 and the microwave signal 406 based on the microwave control signal 408 received from a microwave source (e.g., fed through the pump port 218).

The microwave Josephson mixer 402 can transfer information from the superconducting SAW resonator 102 to the superconducting microwave resonator 104 based on a first frequency of the microwave control signal 408. In another example, the microwave Josephson mixer 402 can transfer information from the superconducting microwave resonator 104 to the superconducting SAW resonator 102 based on a second frequency of the microwave control signal 408. For example, a microwave source (e.g., at the pump port 218) can be operated at a first frequency for a first transfer of first information from the superconducting SAW resonator 102 to the superconducting microwave resonator 104. Further, the microwave source can be operated at a second frequency for a second transfer of second information from the superconducting microwave resonator 104 to the superconducting SAW resonator 102.

It is noted that in FIG. 4, the signal is input on the superconducting SAW resonator 102 and output through the superconducting microwave resonator 104. However, the device can be bidirectional and, the signal can be input on the superconducting microwave resonator 104 and output on the superconducting SAW resonator 102. The pump frequency is the same in both cases.

According to some implementations, the microwave Josephson mixer 402 can be utilized as a switch that connects and/or disconnects the superconducting SAW resonator 102 to/from the superconducting microwave resonator 104. The connection and/or disconnection can be based on the presence or the absence of the microwave control signal 408. For example, if there is no microwave control signal 408, the superconducting SAW resonator 102 and the superconducting microwave resonator 104 are not connected (e.g., there is no transfer of information between the resonators). However, if there is a microwave control signal 408, the microwave Josephson mixer 402 can facilitate the transfer of information between the superconducting SAW resonator 102 and the superconducting microwave resonator 104.

Further, an amplitude of the microwave control signal 408 can be modified by the microwave source generating the microwave control signal 408. The amplitude of the microwave control signal 408 can determine whether all or part of the quantum information is transferred (transduced) between the two resonators/modes. Thus, frequency of the microwave control signal 408 can be utilized, by the microwave Josephson mixer 402, to select the modes whose information is swapped or transduced. Further, the microwave Josephson mixer 402 can preserve an energy and a coherence of the transferred quantum signal (information).

Figure 5:
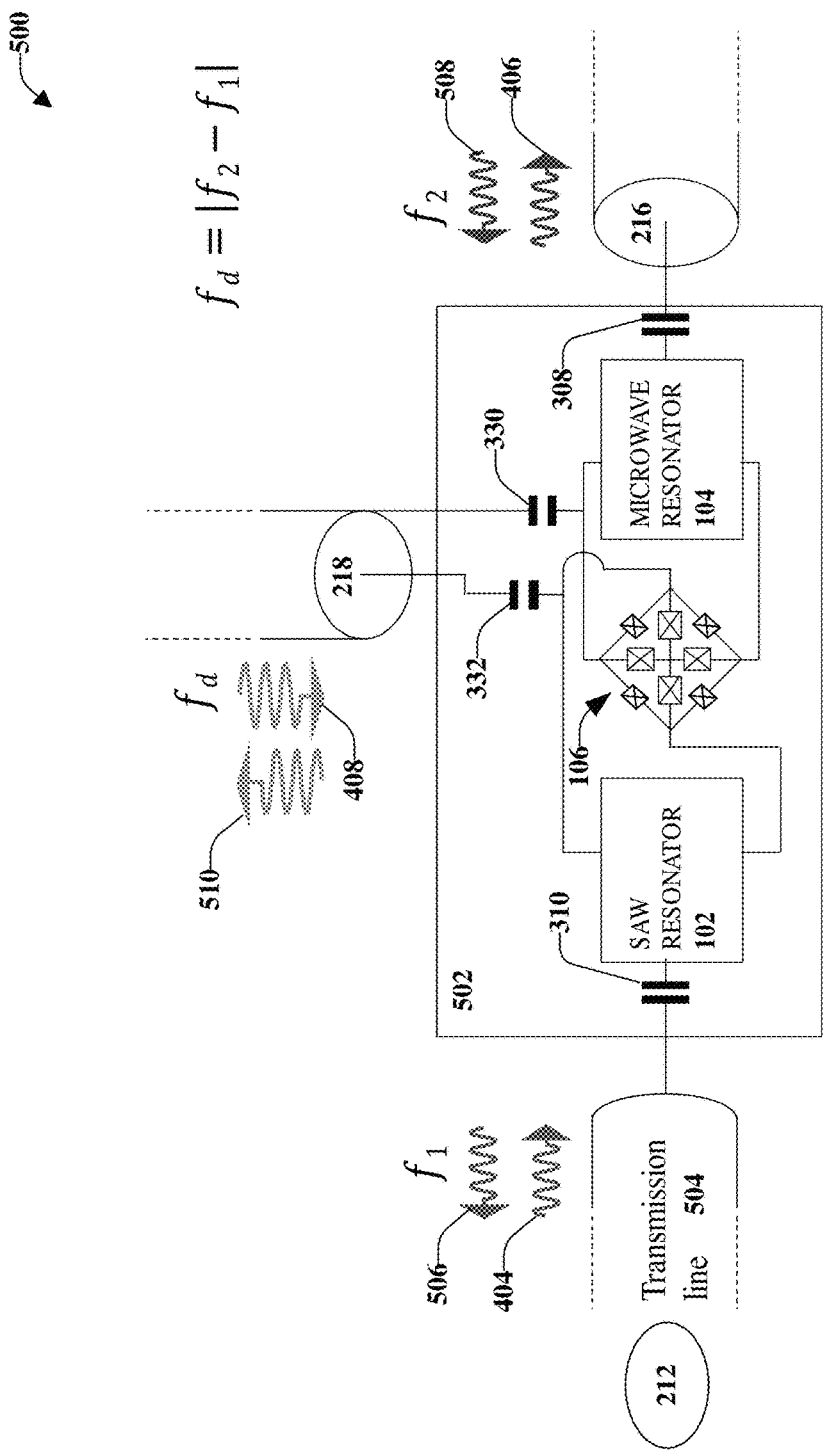
FIG. 5 illustrates an example, non-limiting schematic representation of a system that comprises a lossless frequency converter between a surface acoustic wave and a microwave signal in accordance with one or more embodiments described herein.

FIG. 5 illustrates an example, non-limiting schematic representation of a system 500 that comprises a lossless frequency converter between a surface acoustic wave and a microwave signal in accordance with one or more embodiments described herein. Repetitive description of like elements employed in other embodiments described herein is omitted for sake of brevity. The system 500 can comprise one or more of the components and/or functionality of the circuit 100, the system 400, and vice versa.

As illustrated, the system 500 can comprise the superconducting SAW resonator 102, the superconducting microwave resonator 104, and the JRM 106. In this mode of operation, the amplitude of the microwave control signal 408 (at the pump port 218) can enable full transduction of the quantum information between the superconducting SAW resonator 102 and the superconducting microwave resonator 104. Further to this mode of operation, the microwave frequency of the signal carrier can be upconverted or downconverted (depending on whether the input signal for the device is the SAW signal 404 or a microwave reflection signal 508, respectively).

In further detail, a propagating Radio Frequency (RF) signal in the range of around 0.5 GHz to about 5 GHz can be mapped to a phononic mode in the superconducting SAW resonator 102. The phononic mode can be upconverted to the superconducting microwave resonator 104 via the application of the microwave control signal 408, giving rise to a lossless three-wave mixing interaction. The upconverted microwave signal can become propagating upon leaving the superconducting microwave resonator. The opposite process can also take place in the system 500 at a frequency converter 502 (e.g., the circuit 100 of FIG. 1) and as illustrated by the SAW reflection signal 506. Thus, the frequency of the signal can be converted from $f_1$ to $f_2$, or from $f_2$ to $f_1$.

The pump signal (e.g., the microwave control signal 408) can be utilized to facilitate the conversion. For example, the SAW signal 404 can propagate on a transmission line 504 that can be mapped to a phonic mode in the superconducting SAW resonator 102. Thus, the frequency converter can receive, from the superconducting SAW resonator 102, the SAW signal 404 that can comprise one or more phonons that resonate at a first frequency.

The SAW signal 404 can undergo three-wave mixing at the JRM 106. To facilitate the three-wave mixing, the frequency converter 502 can receive a microwave control signal 408.

Upon or after the three-wave mixing, the JRM 106 can upconvert the SAW signal 404 to the microwave signal 406. The upconverted signal can exit at the idler port 216 and can propagate on the transmission line 504. For example, the frequency converter 502 can implement a lossless frequency conversion between first information of the superconducting SAW resonator 102 and second information of the superconducting microwave resonator 104 based on a pump signal (e.g., the microwave control signal 408) received from the microwave source. The opposite process operates in a similar manner.

The microwave control signal 408 frequency ($f_d$) can be equal to the absolute value of the microwave signal 406 frequency ($f_2$) minus the SAW signal 404 frequency ($f_1$). This can be expressed as: $f_d=|f_2-f_1|$. Therefore, a first value of the microwave control signal frequency can be equal to an absolute value of the frequency difference between the resonance frequencies of the superconducting microwave resonator 104 and the superconducting SAW resonator 102.

According to some aspects, implementation of the lossless frequency conversion can comprise mapping a propagating radio frequency signal to a phononic mode in the superconducting SAW resonator 102. Further to these aspects, the frequency converter 502 can upconvert the phononic mode to a photonic mode in the superconducting microwave resonator 104 via an application of a microwave control signal frequency (e.g., the microwave control signal 408) with a defined frequency. Up-conversion of the phononic mode is facilitated by a lossless three-wave mixing interaction. Further, an upconverted microwave signal can propagate upon leaving the superconducting microwave resonator 104.

In accordance with an aspect, implementing the lossless frequency conversion can comprise mapping a propagating radio frequency signal to a photonic mode in the superconducting microwave resonator 104. Further to these aspects, the frequency converter 502 can downconvert the photonic mode to a phononic mode in the superconducting SAW resonator 102 via an application of a microwave control signal 408 with a defined frequency. The downconversion of the photonic signal can be facilitated by the lossless three-wave mixing interaction. Further, the downconverted surface acoustic wave signal can propagate upon leaving the superconducting SAW resonator 102.

According to some implementations, the frequency converter 502 can transfer information from the superconducting SAW resonator 102 to the superconducting microwave resonator 104 based on a frequency of the microwave control signal 408. Additionally, or alternatively, the frequency converter 502 can transfer information (e.g., quantum information) from the superconducting microwave resonator to the superconducting surface acoustic wave resonator based on a frequency of the microwave control signal.

The conversion process in the system 500 (as well as other systems discussed herein) can be partial. Thus, a first set of information can be converted, while a second set of the information can be retained and reflected back to the respective incoming port. Further, some of the information can be converted using a switch (e.g., implemented by the JRM 106 and the presence and/or absence of the microwave control signal 408) where the frequency determines which SAW mode is coupled to the microwave signal as a selector and/or as a switch. In the case of a switch if there is no pump signal, there is no conversion.

Figure 6:
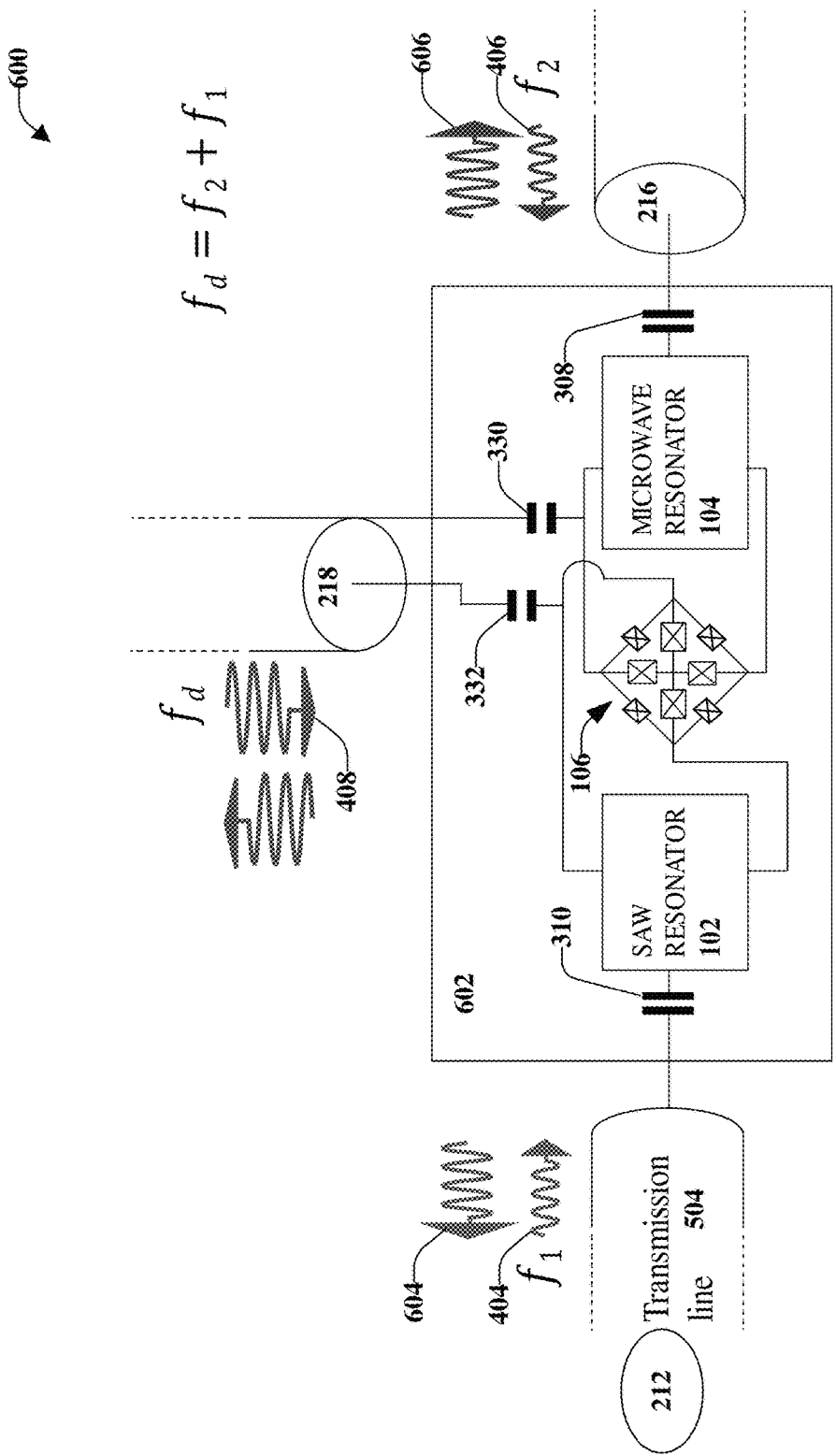
FIG. 6 illustrates an example, non-limiting schematic representation of a system that comprises a nondegenerate parametric Josephson amplifier for surface acoustic waves and microwave signals in accordance with one or more embodiments described herein.

FIG. 6 illustrates an example, non-limiting schematic representation of a system 600 that comprises a nondegenerate parametric Josephson amplifier for surface acoustic waves and microwave signals in accordance with one or more embodiments described herein. Repetitive description of like elements employed in other embodiments described herein is omitted for sake of brevity. The system 600 can comprise one or more of the components and/or functionality of the circuit 100, the system 400, the system 500, and vice versa.

The system 600 can comprise a Josephson parametric amplifier 602 that can function as a phase-preserving quantum-limited amplifier for low-frequency and high-frequency microwave signals. The two quadratures of incoming microwave-signals entering the two ports (e.g., the signal port 212 and the idler port 216) can be amplified at the quantum limit. Amplified outgoing signals can comprise an amplified SAW signal 604 and, an amplified microwave signal 606. The amplified outgoing signals can comprise same-frequency signals reflecting off the same port and frequency-converted signals transmitted to the other port. The incoming signals are represented as small arrows (e.g., weak signals) and the outgoing signals are represented as larger arrows to indicate amplification. Microwave signals, and other parametric signals, can be defined by two quadratures, namely, the amplitude of the signal and the phase of the signal.

In further detail, propagating radio frequency and microwave signals can be mapped respectively to at least one of the phononic modes of the superconducting SAW resonator 102 and at least one of the microwave modes in the superconducting microwave resonator 104. According to some implementations, the phononic modes and the microwave modes can be the fundamental modes, however, the disclosed aspects are not limited to the fundamental modes and other modes can be utilized. The phononic modes and the microwave modes can be amplified at the quantum limit via the application of the microwave drive signal giving rise to a lossless three-wave mixing interaction and mapped back to reflected (e.g., same frequency) and transmitted (e.g., different frequency) amplified radio frequency/microwave signals.

The amplification of the system 700 is nondegenerate. Thus, the two modes can have two different frequencies and can have two different ports. The amplification created by the system 600 can preserve the phase of the microwave signal. Thus, the system 600 can amplify both quadratures of the microwave field, by the same, or a similar, amount. For example, if one quadrature is amplified by a factor of 100, the other quadrature is also amplified by a factor of 100.

According to some implementations, the Josephson parametric amplifier 602 can amplify first quadratures of the SAW signal 404 entering a first port (e.g., the signal port 212) and second quadratures of a microwave signal 406 entering a second port (e.g., the idler port 216). The first quadratures can comprise a first amplitude and a first phase and the second quadratures can comprise a second amplitude and a second phase. Further, a first amplified signal can be output through an output port. The first amplified signal comprises a first reflective signal and a first transmitted signal and a second amplified signal that comprises a second reflective signal and a second transmitted signal. The amplification can include amplification of the first quadratures of the surface acoustic wave signal and the second quadratures of the microwave signal at a defined amplitude gain.

For example, the first reflective signal can comprise a first same-frequency signal reflecting off the first port and the first transmitted signal can comprise a first frequency-converted signal transmitted to the second port. Further, the second reflective signal can comprise a second same-frequency signal reflecting off the second port and the second transmitted signal can comprise a second frequency-converted signal transmitted to the first port.

Figure 7:
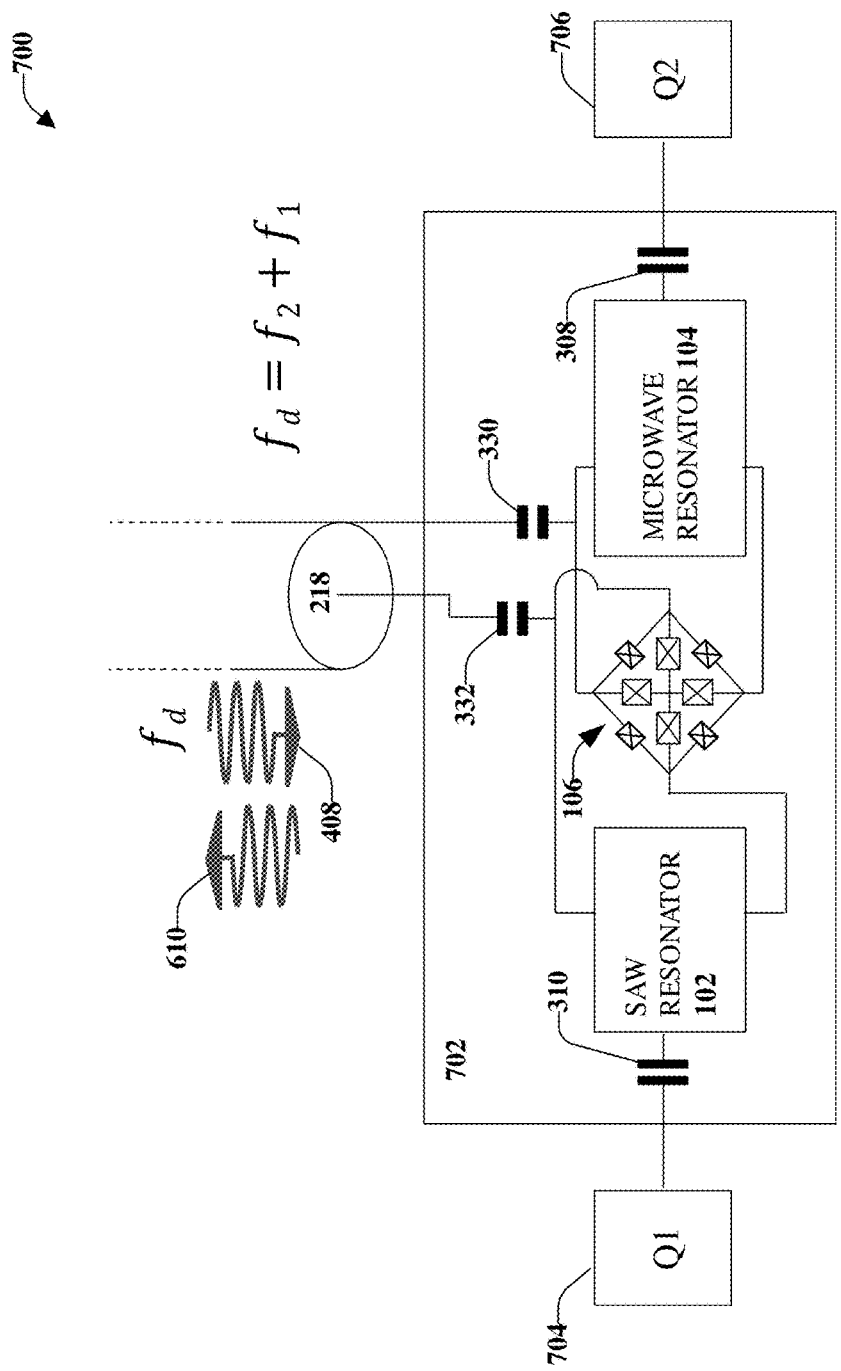
FIG. 7 illustrates an example, non-limiting schematic representation of a system that comprises an entangler of a phononic mode and a photonic mode in accordance with one or more embodiments described herein.

FIG. 7 illustrates an example, non-limiting schematic representation of a system 700 that comprises an entangler of a phononic mode and a photonic mode in accordance with one or more embodiments described herein. Repetitive description of like elements employed in other embodiments described herein is omitted for sake of brevity. The system 700 can comprise one or more of the components and/or functionality of the circuit 100, the system 400, the system 500, the system 600, and vice versa.

The system 700 can comprise an entanglement component 702 that can generate entanglement between a phononic mode and a photonic mode. The system 700 can also comprise a first superconducting qubit 704 capacitively coupled to the superconducting SAW resonator 102 and a second superconducting qubit 706 capacitively coupled to the superconducting microwave resonator 104. Further, the JRM 106 can be coupled to the superconducting SAW resonator 102 and the superconducting microwave resonator 104. Also included in the system 700 can be a pump drive (e.g., fed through the pump port 218) operatively coupled to two adjacent nodes of the JRM 106 via the first coupling capacitor 330 and via the second coupling capacitor 332.

According to an implementation, the pump port 218 can input an input signal, that comprises a first frequency, into the JRM 106. The first superconducting qubit 704 can be operatively coupled to the entanglement component 702 via the superconducting SAW resonator 102 and the second superconducting qubit 706 can be operatively coupled to the entanglement component 702 via the superconducting microwave resonator 104. Further, the entanglement component 702 can output an output signal that comprises an entangled signal that comprises a second frequency of the superconducting SAW resonator 102 and a third frequency of the superconducting microwave resonator 104. According to some implementations, the entanglement component 702 can generate the entangled signal between one or more phonons of a surface acoustic wave (e.g., the amplified SAW signal 604) output by the superconducting SAW resonator 102 and one or more microwave photons (e.g., the amplified microwave signal 606) output by the superconducting microwave resonator 104.

When the entanglement component 702 is operated as a nondegenerate amplifier, entanglement can be generated between the phonons of a SAW signal supported by the superconducting SAW resonator 102 and the microwave photons supported by the superconducting microwave resonator 104. For example, the entanglement can be utilized to entangle superconducting qubits capacitively coupled to the entanglement component 702. It is noted that in practice, the qubits are not directly coupled to the entanglement component 702. Instead, the qubits are coupled to microwave readout resonators which are, in turn, coupled to the entanglement component 702.

According to some implementations, the parametric amplification can create entanglement. Entanglement can occur when the reflected signal is not purely the incoming signal amplified, but is an entangled version of the input signals. For example, the entangled signal can comprise some information coming from the other port. It is noted that the signal is not simply reflected with gain or reflected with amplification. Since there is a three-wave mixing occurring, a portion of the signal is reflected, and another portion is also converted in frequency and transmitted to the other port. For example, the output microwave signal is not purely the input microwave signal amplified, but has also a portion of the SAW signal that was amplified and upconverted in frequency. Thus, the output microwave signal can be a mixture of a reflected incoming microwave signal through the idler port 216 and a frequency-converted transmitted SAW signal entering through the signal port 212. Therefore, the output microwave signal can carry information comprising portions of the two input signals.

As illustrated, there can be one or more qubits, illustrated as the first superconducting qubit 704 and the second superconducting qubit 706, coupled to the entanglement component 702. It is noted that, for purposes of simplification, protection elements (e.g., components that protect the qubits from the amplified signal) between the first superconducting qubit 704 and the entanglement component 702, and between the second superconducting qubit 706 and the entanglement component 702 are not illustrated (such as microwave circulators and isolators). The pump frequency $f_d$ is the sum of the two frequencies. Therefore, the information of the first superconducting qubit 704 can be entangled with the information of the second superconducting qubit 706. Thus, the first superconducting qubit 704 and the second superconducting qubit 706 can be effectively entangled together.

For example, a first measurement can be performed on the first superconducting qubit 704 and a second measurement can be performed on the second superconducting qubit 706. The first measurement and the second measurement enter the entanglement component 702 and are amplified at the output. Therefore, a joint measurement of the first measurement and the second measurement can be performed. The joint measurement creates entanglement between the first superconducting qubit 704 and the second superconducting qubit 706. In this configuration, the first superconducting qubit 704 could be strongly coupled to multimodes, while the second superconducting qubit 706 can be coupled to a single mode.

Figure 8:
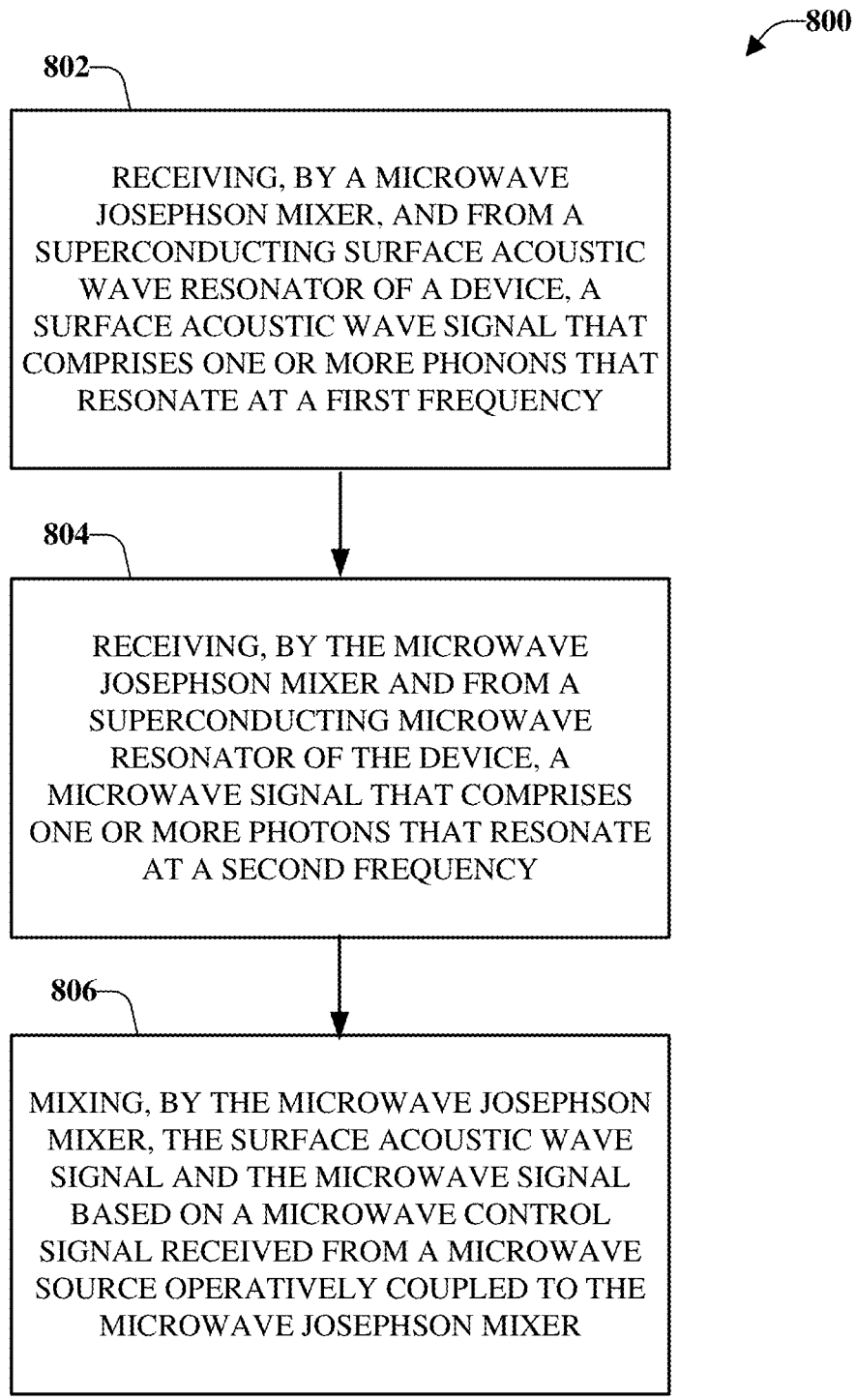
FIG. 8 illustrates a flow diagram of an example, non-limiting, method for mixing surface acoustic waves (phonons) and microwave signals (photons) in accordance with one or more embodiments described herein.

FIG. 8 illustrates a flow diagram of an example, non-limiting, method 800 for mixing surface acoustic waves (phonons) and microwave signals (photons) in accordance with one or more embodiments described herein. Repetitive description of like elements employed in other embodiments described herein is omitted for sake of brevity.

At 802 of the method 800, a surface acoustic wave signal (e.g., the SAW signal 404) that comprise one or more phonons that can resonate at a low frequency can be received (e.g., via the microwave Josephson mixer 402). The surface acoustic wave signal can be received from a superconducting surface acoustic wave resonator (e.g., the superconducting SAW resonator 102) of a device (e.g., the circuit 100). For example, external signals coming from quantum systems enter the device ports and can be mapped to phononic and photonic modes in the microwave resonator and the SAW resonator.

Further, at 804 of the method 800, a microwave signal (e.g., the microwave signal 406) that comprises one or more photons that can resonate at a second frequency can be received (e.g., via the microwave Josephson mixer 402). The microwave signal can be received from a superconducting microwave resonator (e.g., the superconducting microwave resonator 104).

At 806 of the method 800, the surface acoustic wave signal and the microwave signal can be mixed (e.g., via the microwave Josephson mixer 402). The mixing can be based on a microwave control signal (e.g., the microwave control signal 408) received from a microwave source (e.g., fed through the pump port 218). According to some implementations, mixing the surface acoustic wave signal and the microwave signal can comprise preserving, by the microwave Josephson mixer and the microwave control signal, the quantum information carried by the surface acoustic wave signal and/or the microwave signal. Thus, external signals coming from quantum systems enter the device ports and are mapped to phononic and photonic modes in the microwave resonator and the SAW resonator.

The method 800 can perform dissipationless, three-wave mixing and amplification between low microwave frequencies of the superconducting surface acoustic wave resonator and high microwave frequencies of the superconducting microwave resonator. Further, quantum information carried by a surface acoustic wave signal can be transduced into a microwave signal or vice versa in a unitary manner (e.g., the energy and phase coherence of the quantum signal are preserved). Also, this quantum operation can be controlled and enabled by a separate microwave control signal (referred to as the pump) received by the device.

Figure 9:
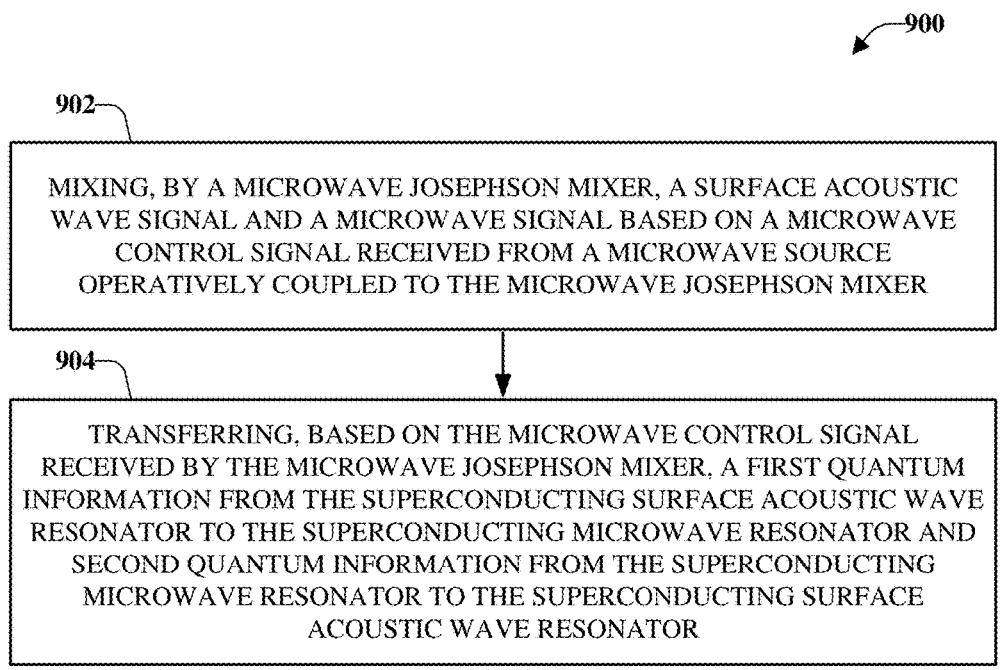
FIG. 9 illustrates a flow diagram of an example, non-limiting, method for mixing surface acoustic waves and microwave signals based on a frequency of a microwave control signal in accordance with one or more embodiments described herein.

FIG. 9 illustrates a flow diagram of an example, non-limiting, method 900 for mixing surface acoustic waves and microwave signals based on a frequency of a microwave control signal in accordance with one or more embodiments described herein. Repetitive description of like elements employed in other embodiments described herein is omitted for sake of brevity.

At 902 of the method 900, a surface acoustic wave signal (e.g., the SAW signal 404) and a microwave signal (e.g., the microwave signal 406) can be mixed (e.g., via the microwave Josephson mixer 402). For example, the mixing by the microwave Josephson mixer can be based on a microwave control signal (e.g., the microwave control signal 408) received from a microwave source (e.g., fed through the pump port 218) operatively coupled to the microwave Josephson mixer.

The pump drive can be applied at the frequency difference between the microwave and SAW signals. For example, at 904 of the method 900, a first quantum information can be transferred from the superconducting surface acoustic wave resonator (e.g., the superconducting SAW resonator 102) to the superconducting microwave resonator (e.g., the superconducting microwave resonator 104) and second quantum information can be transferred from the superconducting microwave resonator to the superconducting surface acoustic wave resonator. The transfer of the first quantum information and the second information can be enabled by a microwave control signal received by the microwave Josephson mixer. Thus, the same pump frequency and amplitude can be applied for transducing a same amount of information in both directions (e.g., from the superconducting surface acoustic wave to the superconducting microwave resonator and from the superconducting microwave resonator to the superconducting surface acoustic wave).

Figure 10:
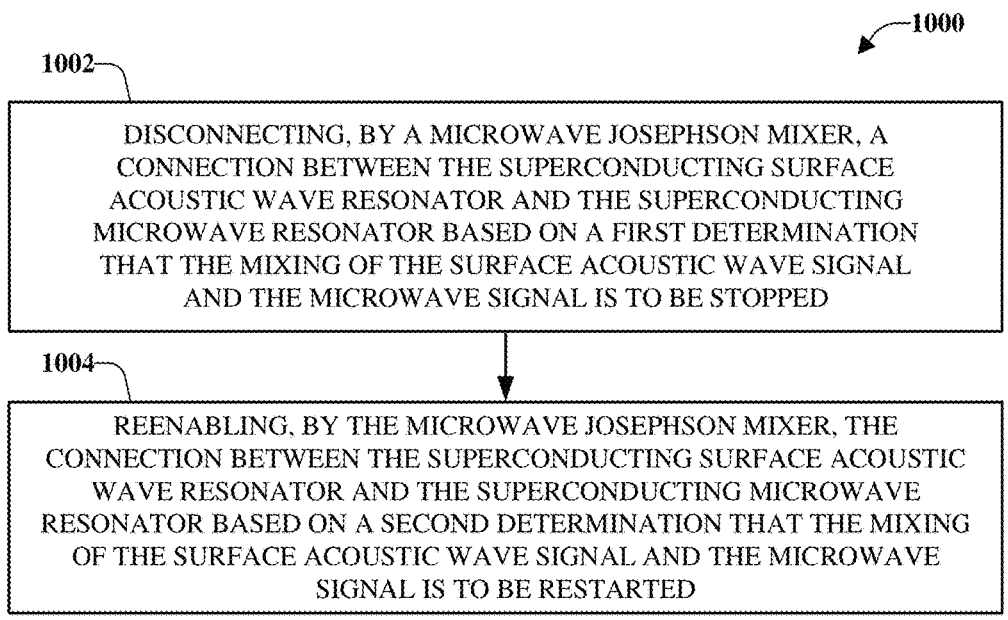
FIG. 10 illustrates a flow diagram of an example, non-limiting, method for operations of a switch utilized to mix surface acoustic waves and microwave signals based on a frequency and amplitude of a microwave control signal in accordance with one or more embodiments described herein.

FIG. 10 illustrates a flow diagram of an example, non-limiting, method 1000 for operations of a switch utilized to mix surface acoustic waves and microwave signals based on a frequency and amplitude of a microwave control signal in accordance with one or more embodiments described herein. Repetitive description of like elements employed in other embodiments described herein is omitted for sake of brevity.

At 1002 of the method 1000, a connection between the superconducting surface acoustic wave resonator and the superconducting microwave resonator can be disconnected (e.g., via the microwave Josephson mixer 402 or the JRM 106). The disconnection can be based on a first determination that the mixing of the surface acoustic wave signal and the microwave signal is to be stopped. Thus, communication between the superconducting surface acoustic wave resonator and the superconducting microwave resonator is disconnected.

Further, at 1004 of the method 1000, the connection between the superconducting surface acoustic wave resonator and the superconducting microwave resonator can be reenabled (e.g., via the microwave Josephson mixer 402 or the JRM 106). Reenabling the connection can be based on a second determination that the mixing of the surface acoustic wave signal and the microwave signal is to be restarted. Thus, communication between the superconducting surface acoustic wave resonator and the superconducting microwave resonator is enabled (or connected).

Figure 11:
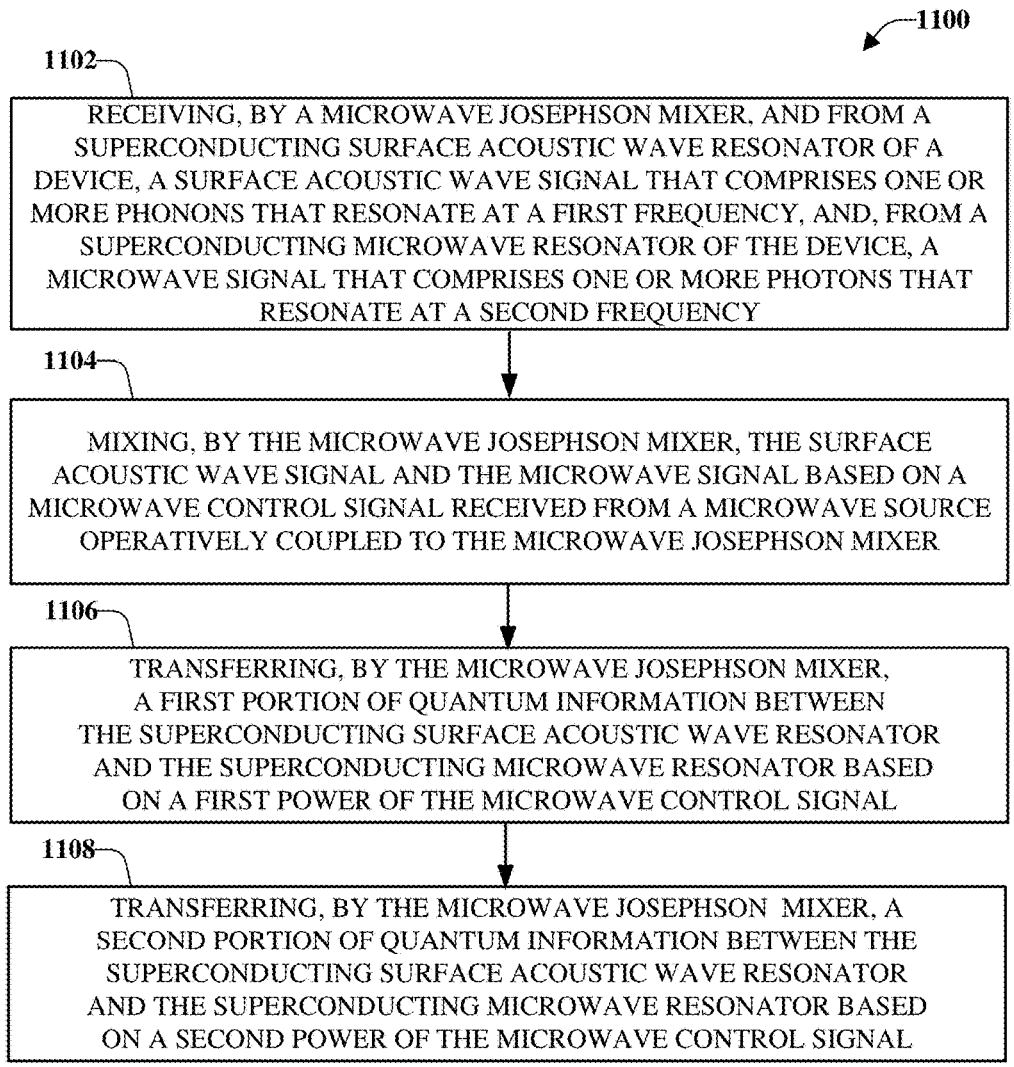
FIG. 11 illustrates a flow diagram of an example, non-limiting, method for mixing surface acoustic waves and microwave signals based on an amplitude of a microwave signal in accordance with one or more embodiments described herein.

FIG. 11 illustrates a flow diagram of an example, non-limiting, method 1100 for mixing surface acoustic waves and microwave signals based on an amplitude of a microwave signal in accordance with one or more embodiments described herein. Repetitive description of like elements employed in other embodiments described herein is omitted for sake of brevity.

At 1102 of the method 1100, a surface acoustic wave signal (e.g., the SAW signal 404) and a microwave signal (e.g., the microwave signal 406) can be received (e.g., via the microwave Josephson mixer 402). At 1104 of the method 1100, the surface acoustic wave signal and the microwave signal can be mixed (e.g., via the microwave Josephson mixer 402). The mixing can be based on a microwave control signal (e.g., the microwave control signal 408) received from a microwave source (e.g., fed through the pump port 218).

Further, at 1106 of the method 1100, a first portion of quantum information can be transferred between the superconducting surface acoustic wave resonator and the superconducting microwave resonator based on a first amplitude of the microwave control signal (e.g., via the microwave Josephson mixer 402). At 1108 of the method 1100, a second portion of quantum information can be transferred between the superconducting surface acoustic wave resonator and the superconducting microwave resonator based on a second amplitude of the microwave control signal (e.g., via the microwave Josephson mixer 402). For example, a first amplitude can be utilized to transfer a first portion of information between the superconducting surface acoustic wave resonator and the superconducting microwave resonator. A second amplitude can be utilized to transfer a second portion of the information between the superconducting surface acoustic wave resonator and the superconducting microwave resonator.

Figure 12:
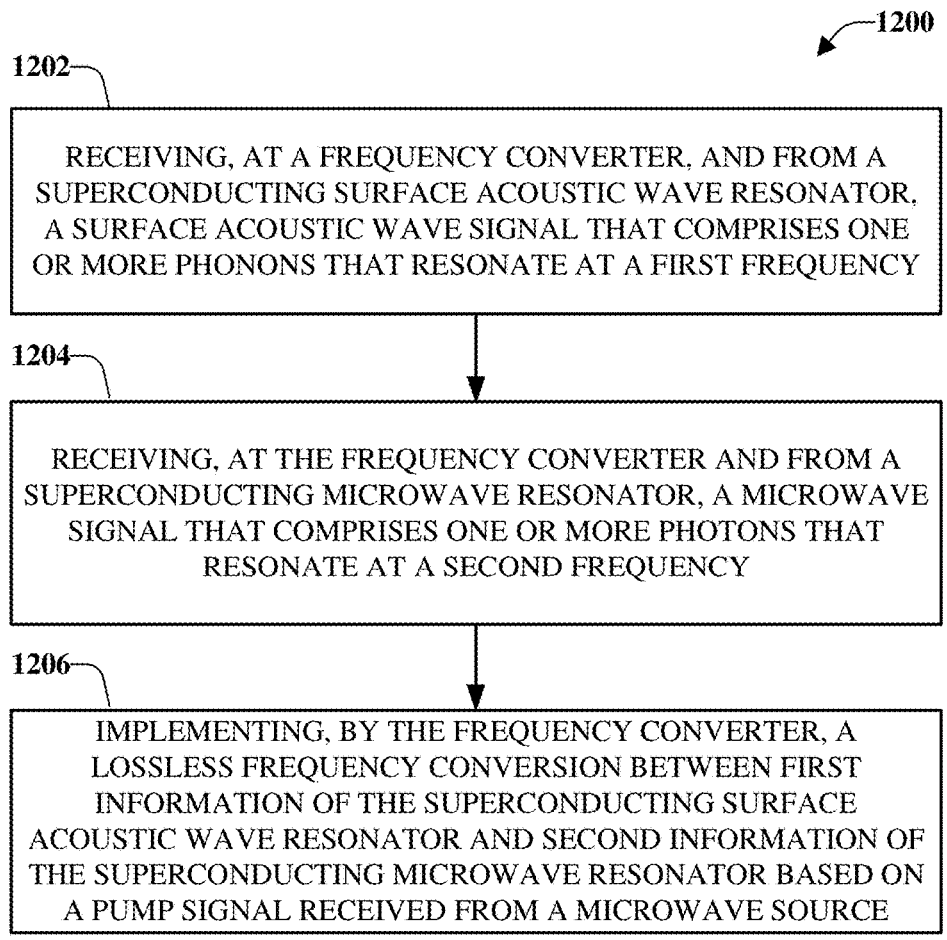
FIG. 12 illustrates a flow diagram of an example, non-limiting, method for a lossless frequency conversion between a surface acoustic wave and a microwave signal in accordance with one or more embodiments described herein.

FIG. 12 illustrates a flow diagram of an example, non-limiting, method 1200 for a lossless frequency conversion between a surface acoustic wave and a microwave signal in accordance with one or more embodiments described herein. Repetitive description of like elements employed in other embodiments described herein is omitted for sake of brevity.

At 1202 of the method 1200, a surface acoustic wave signal (e.g., the SAW signal 404) can be received (e.g., via the frequency converter 502). Further, at 1204 of the method 1200 a microwave signal (e.g., the microwave signal 406) can be received (e.g., via the frequency converter 502). At 1206 of the method 1200, a lossless frequency conversion can be implemented between first information of the superconducting surface acoustic wave resonator and second information of the superconducting microwave resonator based on a pump signal received from a microwave source (e.g., via the frequency converter 502).

According to some implementations, the frequency converter can transfer quantum information from the superconducting surface acoustic wave resonator to the superconducting microwave resonator based on the frequency and amplitude of the microwave control signal and vice versa.

Figure 13:
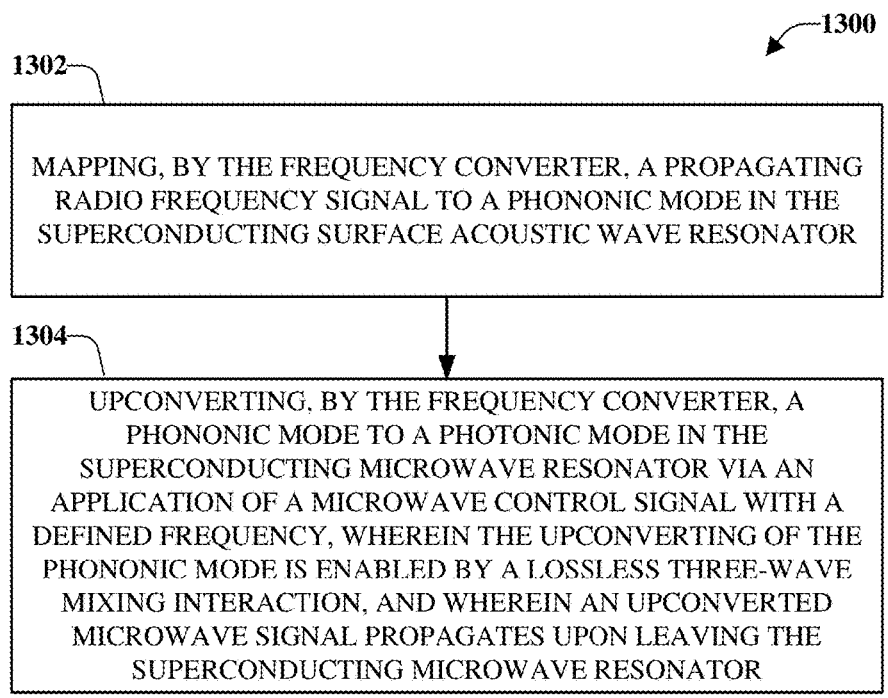
FIG. 13 illustrates a flow diagram of an example, non-limiting, method for performing an up-conversion from a surface acoustic wave signal to a microwave signal in accordance with one or more embodiments described herein.

FIG. 13 illustrates a flow diagram of an example, non-limiting, method 1300 for performing an up-conversion between a surface acoustic wave signal and a microwave signal in accordance with one or more embodiments described herein. Repetitive description of like elements employed in other embodiments described herein is omitted for sake of brevity.

At 1302, a propagating radio frequency signal can be mapped to a phononic mode in a superconducting surface acoustic wave resonator (e.g., via the frequency converter 502). Further, at 1304, the phononic mode can be upconverted to a photonic mode in the superconducting microwave resonator via an application of a microwave control signal (e.g., via the frequency converter 502) of a microwave source. Upconverting the photonic mode is enabled by a lossless three-wave mixing interaction. An upconverted microwave signal can propagate upon leaving the superconducting microwave resonator. According to some implementations, the microwave control signal frequency can be equal to an absolute value of the resonance frequency of the superconducting microwave resonator minus the resonance frequency of the SAW resonator.

Figure 14:
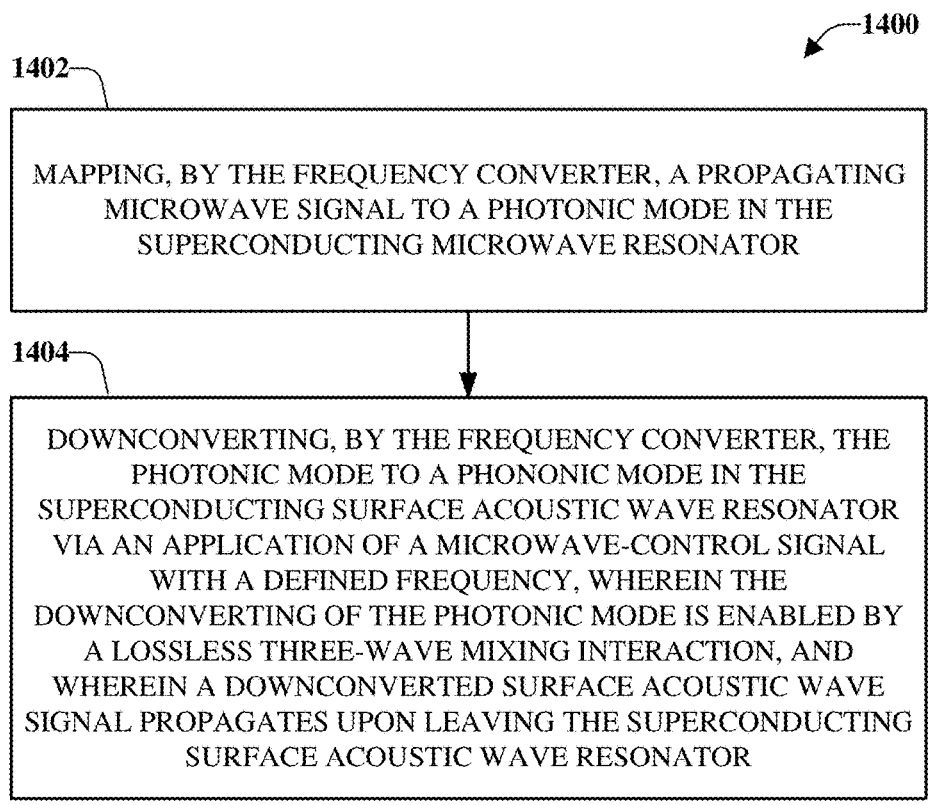
FIG. 14 illustrates a flow diagram of an example, non-limiting, method for performing a down-conversion from a microwave signal to a surface acoustic wave signal in accordance with one or more embodiments described herein.

FIG. 14 illustrates a flow diagram of an example, non-limiting, method 1400 for performing a down-conversion between a surface acoustic wave signal and a microwave signal in accordance with one or more embodiments described herein. Repetitive description of like elements employed in other embodiments described herein is omitted for sake of brevity.

At 1402 of the method 1400, a propagating microwave frequency signal can be mapped to a photonic mode in the superconducting microwave resonator (e.g., via the frequency converter 502). At 1404 of the method 1400, the photonic mode can be downconverted to a phononic mode in the superconducting surface acoustic wave resonator via an application of a microwave control signal (e.g., via the frequency converter 502) of a microwave source. Downconverting the photonic mode is enabled by a lossless three-wave mixing interaction. Further, a downconverted surface acoustic wave signal propagates upon leaving the superconducting SAW resonator.

Figure 15:
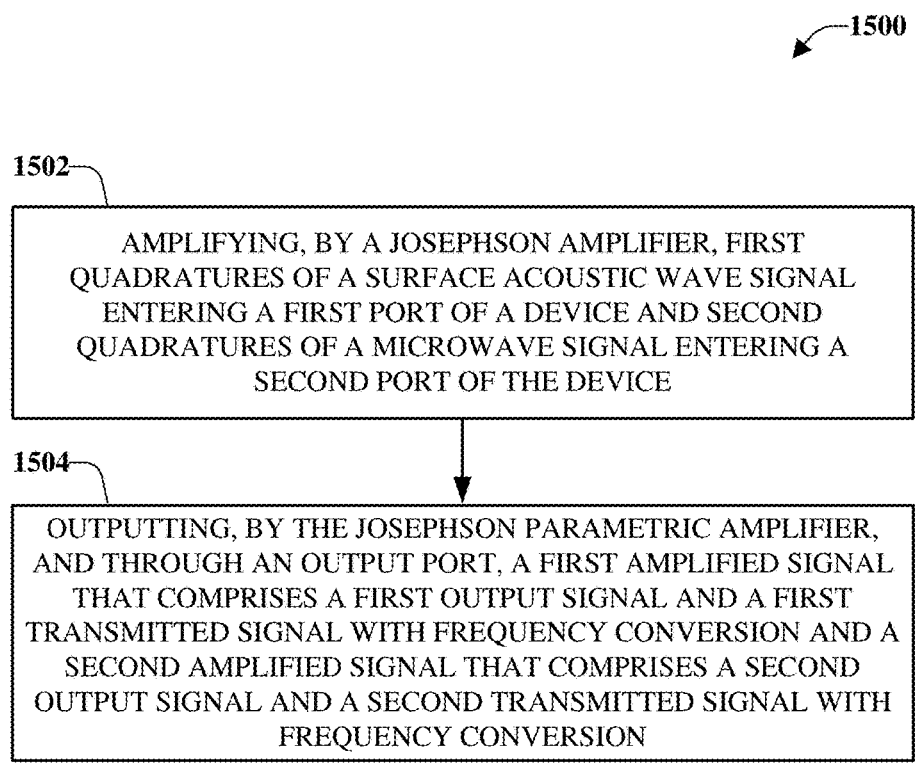
FIG. 15 illustrates a flow diagram of an example, non-limiting, method for performing nondegenerate parametric amplification for surface acoustic waves and microwave signals in accordance with one or more embodiments described herein.

FIG. 15 illustrates a flow diagram of an example, non-limiting, method 1500 for performing nondegenerate parametric amplification for surface acoustic waves and microwave signals in accordance with one or more embodiments described herein. Repetitive description of like elements employed in other embodiments described herein is omitted for sake of brevity.

At 1502 of the method 1500, first quadratures of a surface acoustic wave signal entering a first port of a device and second quadratures of a microwave signal entering a second port of the device can be amplified (e.g., via the Josephson parametric amplifier 602). In an example, the amplification can comprise amplifying the first quadratures of the surface acoustic wave signal and the second quadratures of the microwave signal at a defined amplitude gain value (e.g., measured with respect to noise or a reference when no microwave control signal is applied to the superconducting device).

Further, at 1504, the method 1500 can output, through a first output port, a first amplified signal that comprises a first output signal and a first transmitted signal with frequency conversion and, through a second output port, a second amplified signal that comprises a second output signal and a second transmitted signal with the frequency conversion (e.g., Josephson parametric amplifier 602). According to some implementations, the first output signal can comprise a first same-frequency signal reflecting off the first port and a first transmitted signal can comprise a first frequency-converted signal transmitted from the second port to the first port. Further, the second output signal can comprise a second same-frequency signal reflecting off the second port and a second transmitted signal can comprise a second frequency-converted signal transmitted from the first port to the second port.

Figure 16:
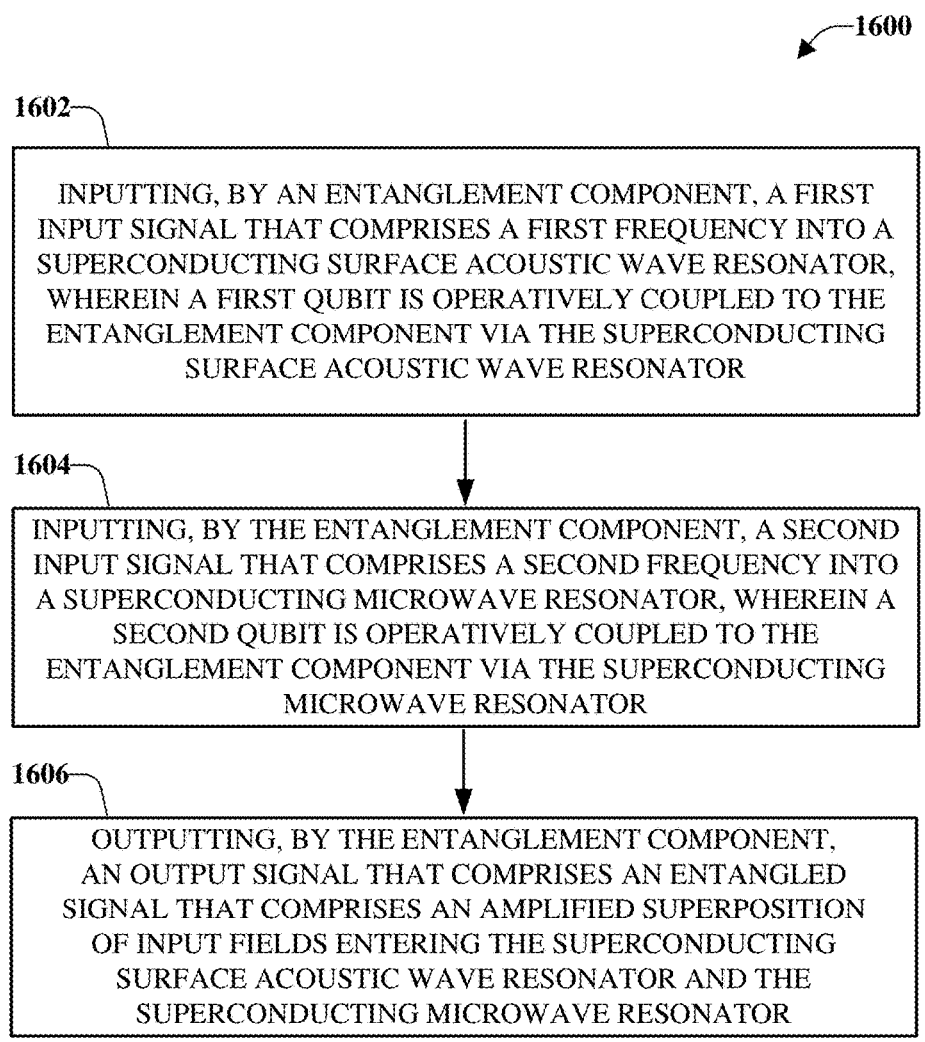
FIG. 16 illustrates a flow diagram of an example, non-limiting, method for entangling a phononic mode and a photonic mode of a quantum circuit in accordance with one or more embodiments described herein.

FIG. 16 illustrates a flow diagram of an example, non-limiting, method 1600 for entangling a phononic mode and a photonic mode of a quantum circuit in accordance with one or more embodiments described herein. Repetitive description of like elements employed in other embodiments described herein is omitted for sake of brevity.

At 1602, a first input signal that comprises a first frequency can be input into a superconducting surface acoustic wave resonator (e.g., via the entanglement component 702).

At 1604, a second input signal that comprises a second frequency can be input into a superconducting microwave resonator.

Further, at 1606 of the method 1600 an output signal that comprises an entangled signal that comprises an amplified superposition of the input fields (or input signals) entering the superconducting microwave and SAW resonators can be output (e.g., via the entanglement component 702). For example, the input filed (or input signals) can be the first input signal and the second input signal. The method can include generating the entangled signal between one or more phonons of a surface acoustic wave output by the superconducting surface acoustic wave resonator and one or more microwave photons output by the superconducting microwave resonator.

A first qubit can be operatively coupled to the entanglement component via the superconducting surface acoustic wave resonator. Further, a second qubit can be operatively coupled to the entanglement component via the superconducting microwave resonator. In some implementations, the first qubit can be operatively coupled to two or more modes. Further, to these implementations the second qubit can be operatively coupled to a single mode. The entangled signal can comprise an entanglement between a phononic mode and a photonic mode. According to some implementations, the entangled signal can comprise an amplified superposition of input signals entering the superconducting microwave resonator and the superconducting surface acoustic wave resonator.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or storage media.

Figure 17:
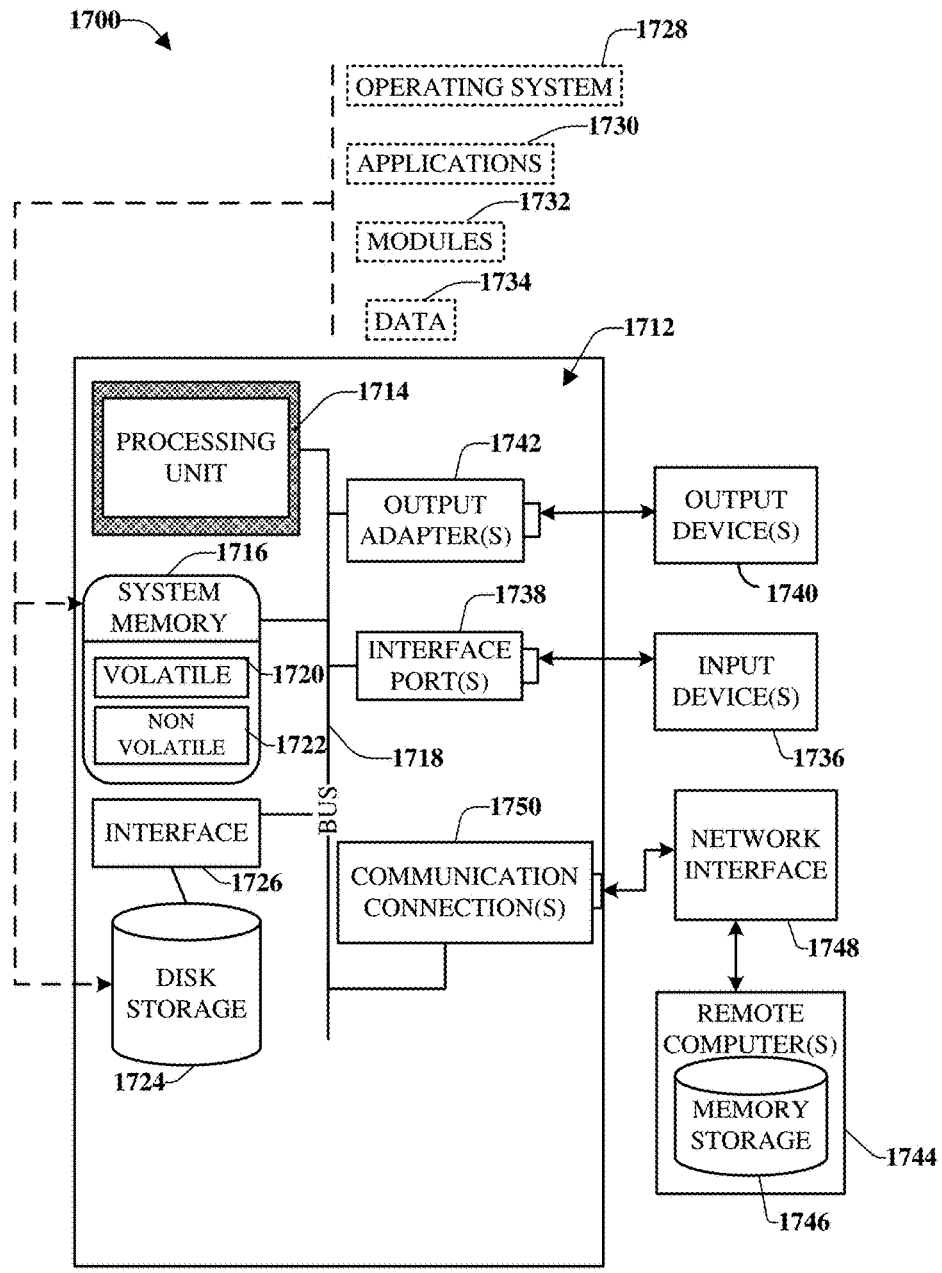
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is omitted for sake of brevity. With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a method of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    receiving, by a microwave Josephson mixer, and from a superconducting surface acoustic wave resonator of a superconducting device, a surface acoustic wave signal that comprises one or more phonons that resonate at a first frequency;
    receiving, by the microwave Josephson mixer and from a superconducting microwave resonator of the superconducting device, a microwave signal that comprises one or more photons that resonate at a second frequency; and mixing, by the microwave Josephson mixer, the surface acoustic wave signal and the microwave signal based on a microwave control signal received from a microwave source operatively coupled to the microwave Josephson mixer.

2. The method of claim 1, further comprising:
transferring, by the microwave Josephson mixer, quantum information from the superconducting surface acoustic wave resonator to the superconducting microwave resonator based on an application of pump drive applied at a frequency difference between the microwave signal and the surface acoustic wave signal.

3. The method of claim 1, further comprising:
transferring, by the microwave Josephson mixer, quantum information from the superconducting microwave resonator to the superconducting surface acoustic wave resonator based on an application of a pump drive applied at a frequency difference between the surface acoustic wave signal and the microwave signal.

4. The method of claim 1, further comprising:
transferring, based on the microwave control signal received by the microwave Josephson mixer, a first quantum information from the superconducting surface acoustic wave resonator to the superconducting microwave resonator and second quantum information from the superconducting microwave resonator to the superconducting surface acoustic wave resonator.

5. The method of claim 1, further comprising:
disconnecting, by the microwave Josephson mixer, a connection between the superconducting surface acoustic wave resonator and the superconducting microwave resonator based on determining that the mixing of the surface acoustic wave signal and the microwave signal is to be stopped.

6. The method of claim 5, further comprising:
reenabling, by the microwave Josephson mixer, the connection between the superconducting surface acoustic wave resonator and the superconducting microwave resonator based on determining that the mixing of the surface acoustic wave signal and the microwave signal is to be restarted.

7. The method of claim 1, further comprising:
transferring, by the microwave Josephson mixer, a first portion of quantum information between the superconducting surface acoustic wave resonator and the superconducting microwave resonator based on a first power of the microwave control signal; and
transferring, by the microwave Josephson mixer, a second portion of quantum information between the superconducting surface acoustic wave resonator and the superconducting microwave resonator based on a second power of the microwave control signal.

8. The method of claim 1, wherein the mixing the surface acoustic wave signal and the microwave signal comprises transducing information carried by the surface acoustic wave signal into the microwave signal in a unitary manner.

9. The method of claim 1, wherein the mixing the surface acoustic wave signal and the microwave signal comprises transducing information carried by the microwave signal into the surface acoustic wave signal in a unitary manner.

10. A method, comprising:
receiving, at a frequency converter, and from a superconducting surface acoustic wave resonator, a surface acoustic wave signal that comprises one or more phonons that resonate at a first frequency;
receiving, at the frequency converter and from a superconducting microwave resonator, a microwave signal that comprises one or more photons that resonate at a second frequency; and
implementing, by the frequency converter, a lossless frequency conversion between first information of the superconducting surface acoustic wave resonator and second information of the superconducting microwave resonator based on a pump signal received from a microwave source.

11. The method of claim 10, wherein the implementing the lossless frequency conversion comprises:
mapping, by the frequency converter, a propagating radio frequency signal to a phononic mode in the superconducting surface acoustic wave resonator; and
upconverting, by the frequency converter, the phononic mode to a photonic mode in the superconducting microwave resonator via an application of a microwave control signal with a defined frequency, wherein the upconverting of the phononic mode is enabled by a lossless three-wave mixing interaction, and wherein an upconverted microwave signal propagates upon leaving the superconducting microwave resonator.

12. The method of claim 11, wherein a first value of a microwave control signal frequency is equal to an absolute value of a frequency difference between a resonance frequency of the superconducting microwave resonator and the superconducting surface acoustic wave resonator.

13. The method of claim 10, wherein the implementing the lossless frequency conversion comprises:
mapping, by the frequency converter, a propagating microwave frequency signal to a photonic mode in the superconducting microwave resonator; and
downconverting, by the frequency converter, the photonic mode to a phononic mode in the superconducting surface acoustic wave resonator via an application of a microwave control signal with a defined frequency, wherein the downconverting of the photonic mode is enabled by a lossless three-wave mixing interaction, and wherein a downconverted surface acoustic wave signal propagates upon leaving the superconducting surface acoustic wave resonator.

14. The method of claim 10, further comprising:
transferring, by the frequency converter, information from the superconducting surface acoustic wave resonator to the superconducting microwave resonator based on a frequency and an amplitude of a microwave control signal.

15. The method of claim 14, wherein the information comprises quantum information.

16. The method of claim 10, further comprising:
transferring, by the frequency converter, information from the superconducting microwave resonator to the superconducting surface acoustic wave resonator based on a frequency and an amplitude of a microwave control signal.

17. A method, comprising:
amplifying, by a Josephson parametric amplifier, first quadratures of a surface acoustic wave signal entering a first port of a device and second quadratures of a microwave signal entering a second port of the device; and
outputting, by the Josephson parametric amplifier, and through a first output port, a first amplified signal that comprises a first output signal and a first transmitted signal with frequency conversion and, through a second output port, a second amplified signal that comprises a second output signal and a second transmitted signal with frequency conversion.

18. The method of claim 17, wherein the first output signal comprises a first same-frequency signal reflecting off the first port and the first transmitted signal comprises a first frequency-converted signal transmitted to the first port from the second port, and wherein the second output signal comprises a second same-frequency signal reflecting off the second port and the second transmitted signal comprises a second frequency-converted signal transmitted to the second port from the first port.

19. The method of claim 17, wherein the amplifying comprises amplifying, by the Josephson parametric amplifier, the first quadratures of the surface acoustic wave signal and the second quadratures of the microwave signal at a defined amplitude gain value.

20. A method, comprising:
inputting, by an entanglement component, a first input signal that comprises a first frequency into a superconducting surface acoustic wave resonator, wherein a first qubit is operatively coupled to the entanglement component via the superconducting surface acoustic wave resonator;
inputting, by the entanglement component a second input signal that comprises a second frequency into a superconducting microwave resonator, wherein a second qubit is operatively coupled to the entanglement component via the superconducting microwave resonator; and
outputting, by the entanglement component, an output signal that comprises an entangled signal that comprises an amplified superposition of input fields entering the superconducting surface acoustic wave resonator and the superconducting microwave resonator.

21. The method of claim 20, further comprising:
generating, by the entanglement component, the entangled signal between one or more phonons of a surface acoustic wave output by the superconducting surface acoustic wave resonator and one or more microwave photons output by the superconducting microwave resonator.

22. The method of claim 20, wherein the entangled signal comprises an entanglement between a phononic mode and a photonic mode.

23. The method of claim 21, wherein the entangled signal comprises an amplified superposition of input signals entering the superconducting microwave resonator and the superconducting surface acoustic wave resonator.

24. A superconducting device, comprising:
a first superconducting qubit capacitively coupled to a superconducting surface acoustic wave resonator;
a second superconducting qubit capacitively coupled to a superconducting microwave resonator; and
a Josephson ring modulator coupled to the superconducting surface acoustic wave resonator and the superconducting microwave resonator.

25. The superconducting device of claim 24, further comprising:
a pump drive operatively coupled to two adjacent nodes of the Josephson ring modulator via a first coupling capacitor and via a second coupling capacitor.

* * * * *